United States Patent
Liao et al.

(10) Patent No.: US 10,333,623 B1
(45) Date of Patent: Jun. 25, 2019

(54) OPTICAL TRANSCEIVER

(71) Applicant: Taiwan Semiconductor Manufacturing Co., Ltd., Hsinchu (TW)

(72) Inventors: Yu-Kuang Liao, Hsinchu (TW); Cheng-Chun Tsai, Hsinchu (TW); Chen-Hua Yu, Hsinchu (TW); Fang-Cheng Chen, Hsin-Chu (TW); Wen-Chih Chiou, Miaoli County (TW); Ping-Jung Wu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/016,657

(22) Filed: Jun. 25, 2018

(51) Int. Cl.
  *G02B 6/42* (2006.01)
  *H01L 33/56* (2010.01)
  *H01L 33/62* (2010.01)
  *H04B 10/40* (2013.01)

(52) U.S. Cl.
  CPC ............ *H04B 10/40* (2013.01); *G02B 6/428* (2013.01); *G02B 6/4283* (2013.01); *H01L 33/56* (2013.01); *H01L 33/62* (2013.01)

(58) Field of Classification Search
  CPC ......... H04B 10/40; H01L 33/56; H01L 33/62; G02B 6/428; G02B 6/4283
  USPC ........................................... 398/139
  See application file for complete search history.

(56) References Cited

U.S. PATENT DOCUMENTS

| | | | |
|---|---|---|---|
| 8,971,676 B1* | 3/2015 | Thacker | G02B 6/12 385/14 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 9,703,056 B2* | 7/2017 | Neelakantan | H01L 27/14629 |
| 2003/0091301 A1* | 5/2003 | Lee | G02B 6/4249 385/89 |
| 2014/0203175 A1* | 7/2014 | Kobrinsky | G02B 6/428 250/214.1 |
| 2015/0222364 A1* | 8/2015 | Hwang | H04B 10/801 398/138 |

* cited by examiner

*Primary Examiner* — Dalzid E Singh
(74) *Attorney, Agent, or Firm* — JCIPRNET

(57) ABSTRACT

An optical transceiver including a photonic integrated circuit component, an electric integrated circuit component and an insulating encapsulant is provided. The photonic integrated circuit component includes at least one optical input/output portion configured to transmit and receive optical signal. The electric integrated circuit component is disposed on and electrically connected to the photonic integrated circuit component. The insulating encapsulant covers the at least one optical input/output portion of the photonic integrated circuit component. The insulating encapsulant laterally encapsulates the electric integrated circuit component. The insulating encapsulant is optically transparent to the optical signal.

20 Claims, 27 Drawing Sheets

OPTICAL TRANSCEIVER

BACKGROUND

Optical transceiver modules are used in high-speed optical communication systems that require high performance, compact package, and low power consumption. Optical transmission/reception functions are implemented in pluggable optical transceiver modules. The optical transceiver modules comply with various international standard specifications at communication speeds ranging up to more than 100 Gbps. Currently, fabrication process of the optical transceiver modules is quite complex and the fabricated optical transceiver modules suffers severe optical loss.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
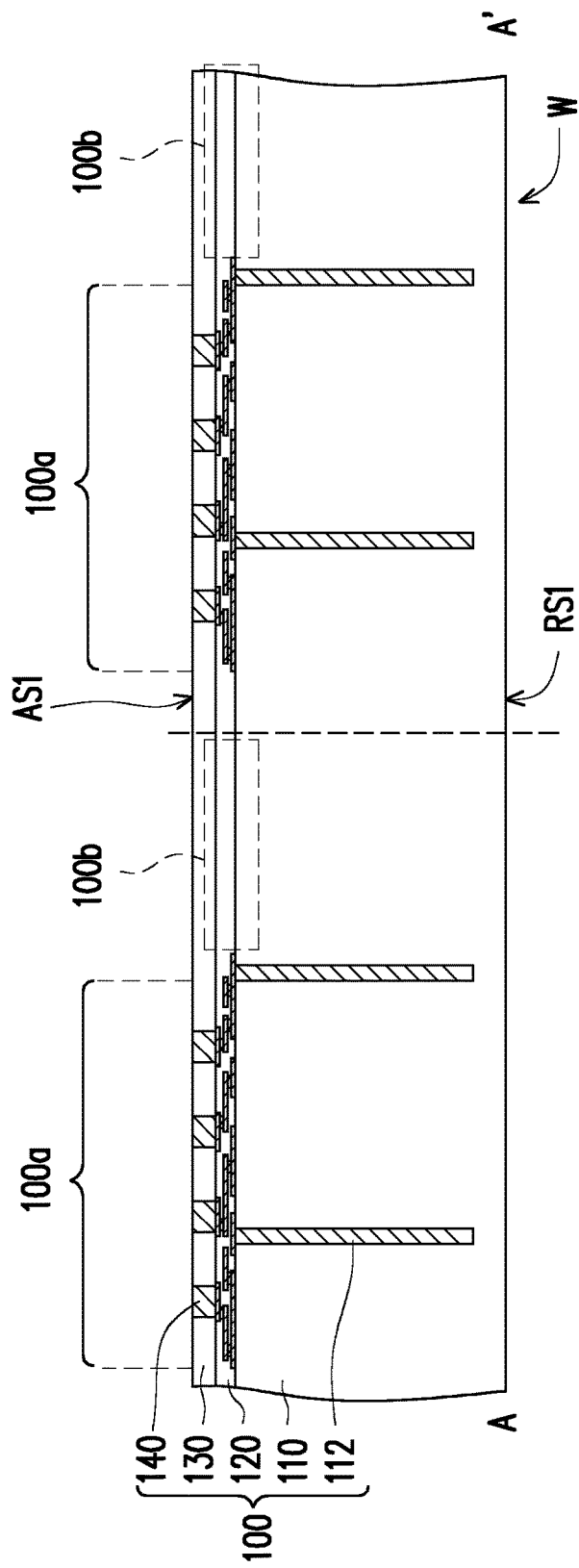
FIGS. 1A through 1H are cross-sectional views illustrating a process flow for fabricating optical transceivers taken along the cross-section line A-A' shown in FIG. 2G in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
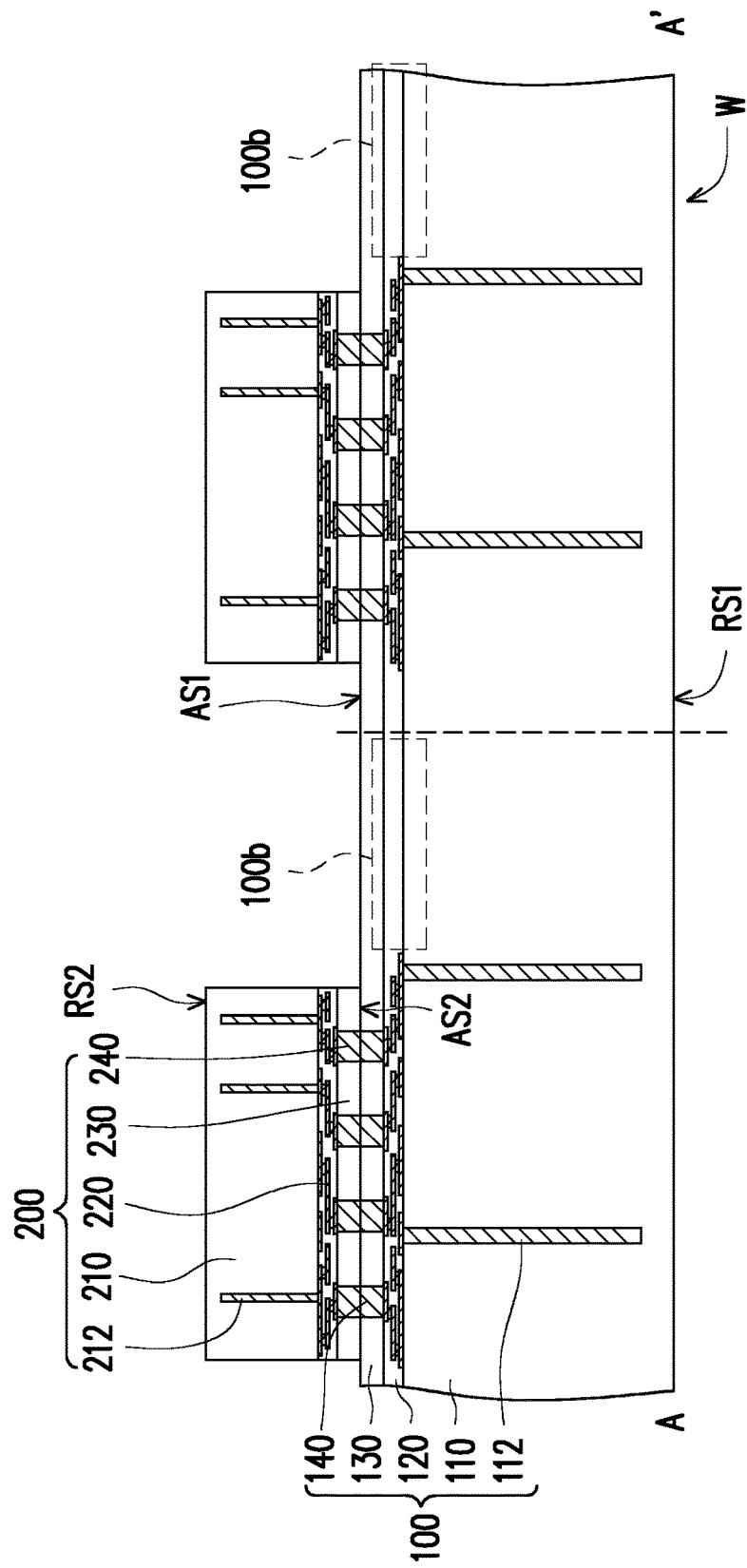
Figure 1C:
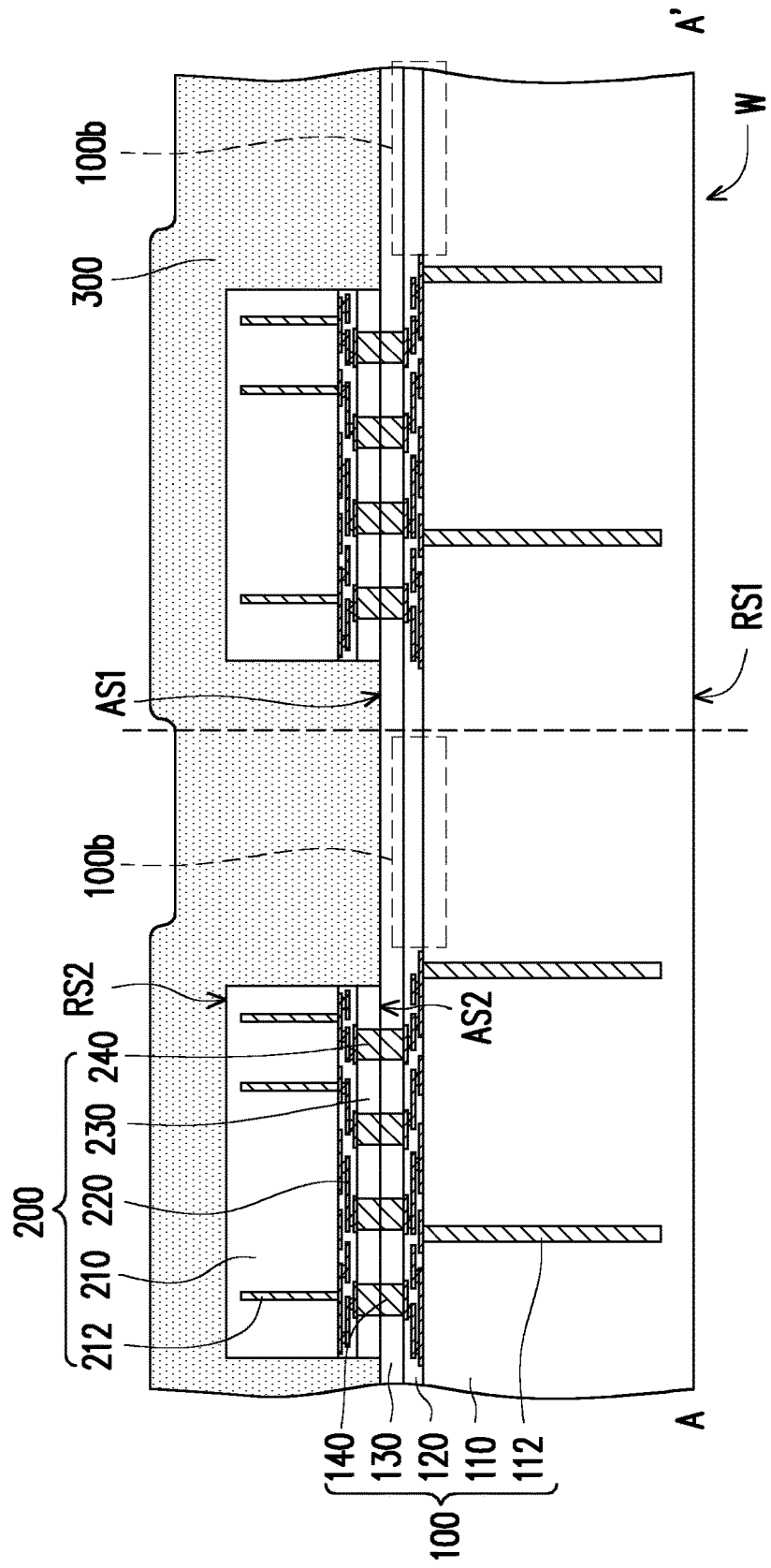
Figure 1D:
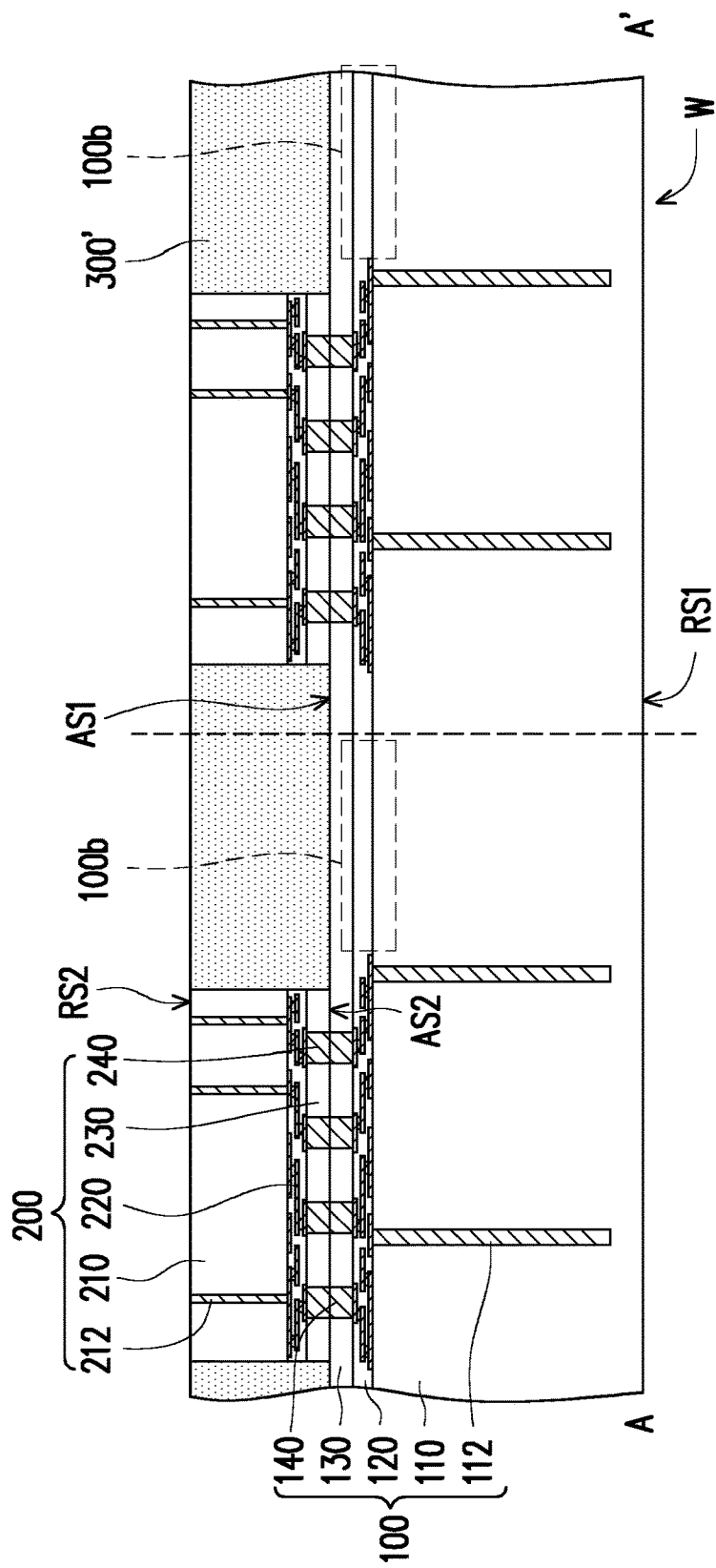
Figure 1E:
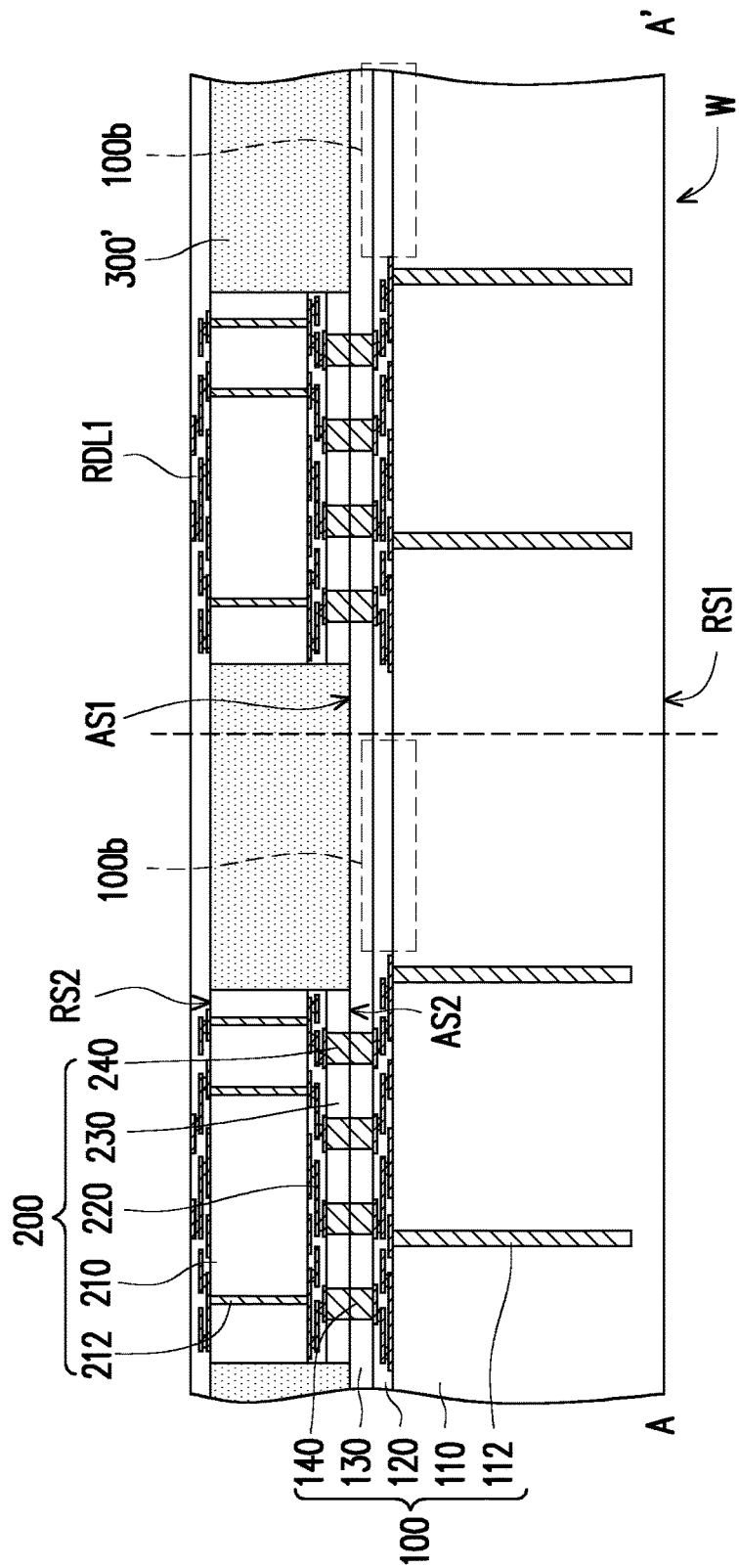
Figure 1F:
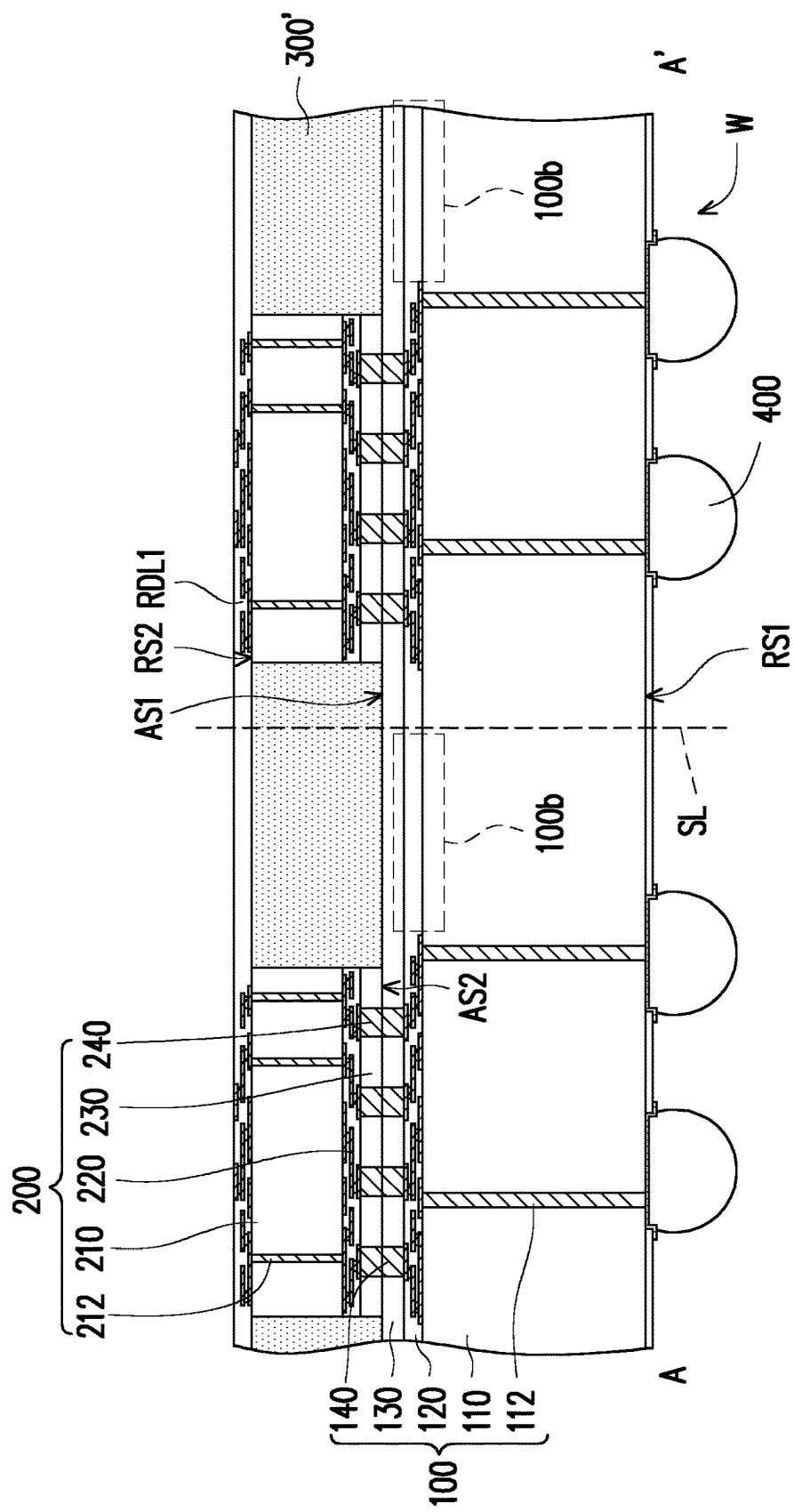
Figure 1G:
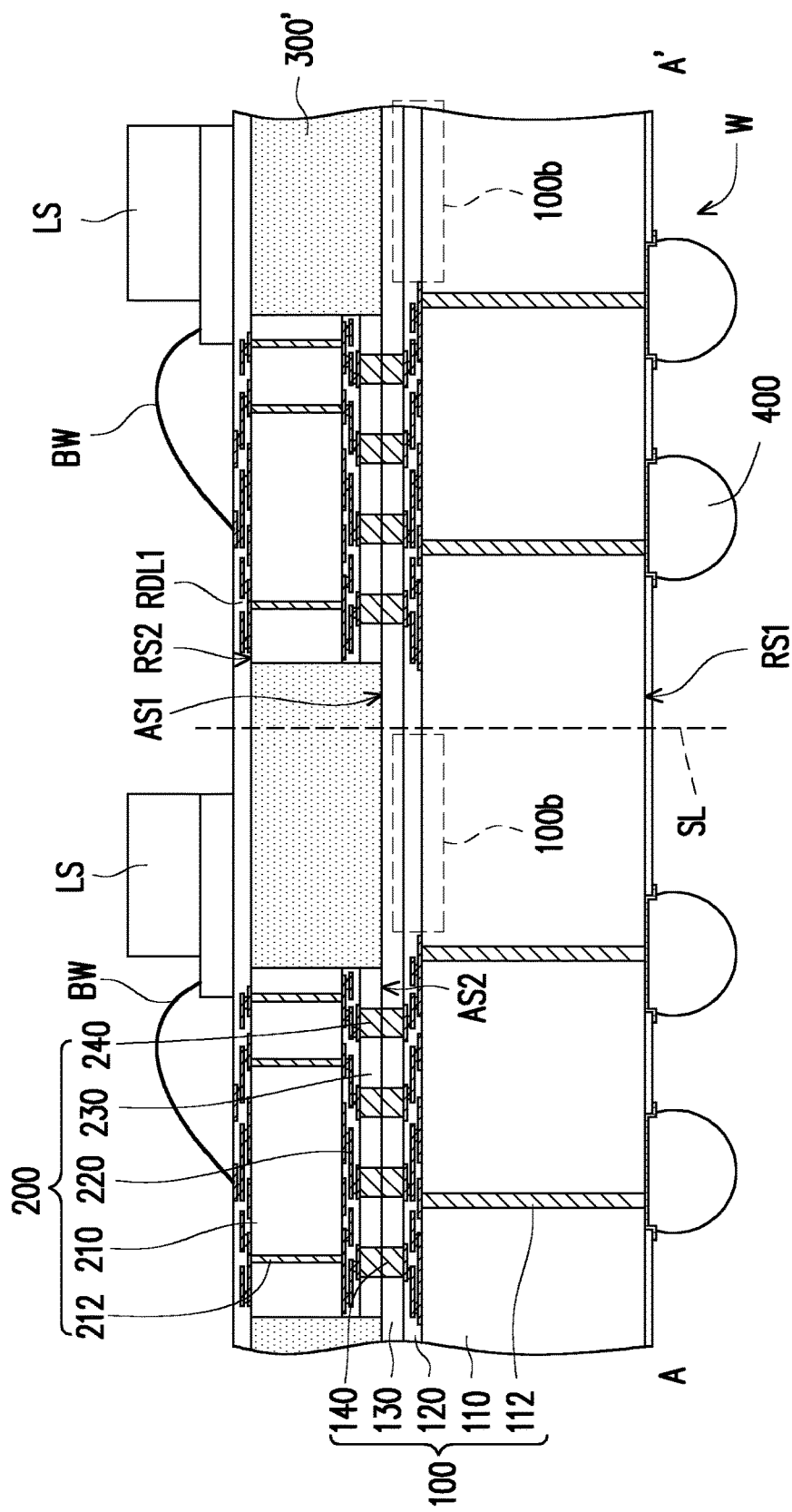
Figure 1H:
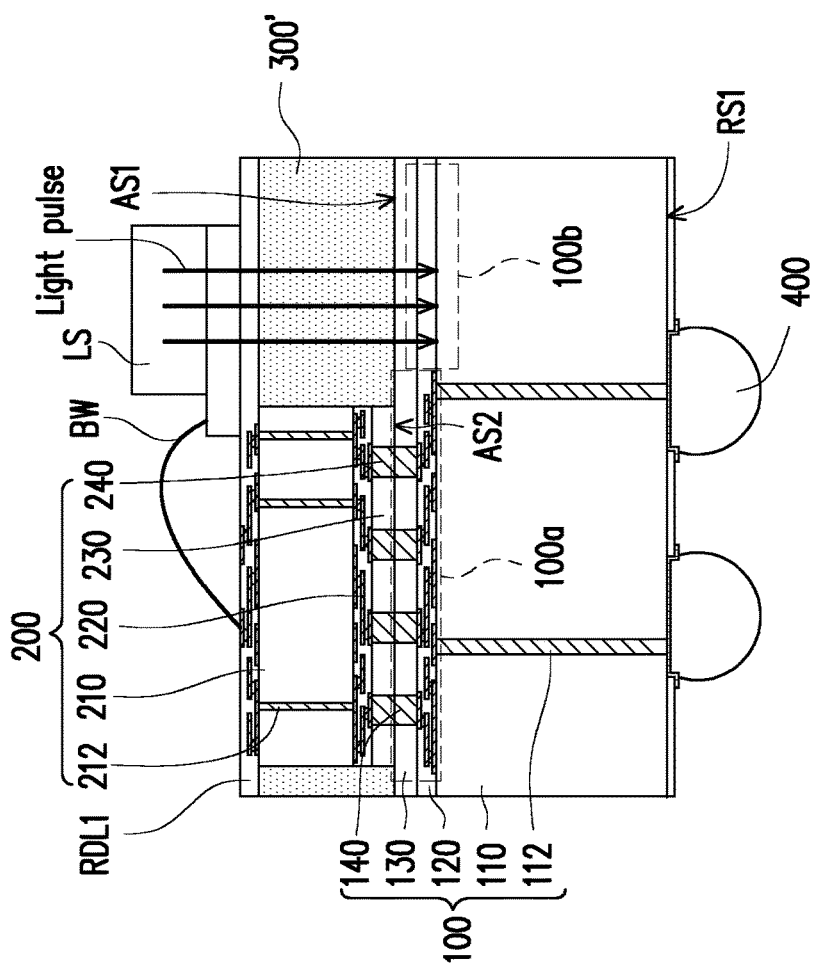
Figure 2A:
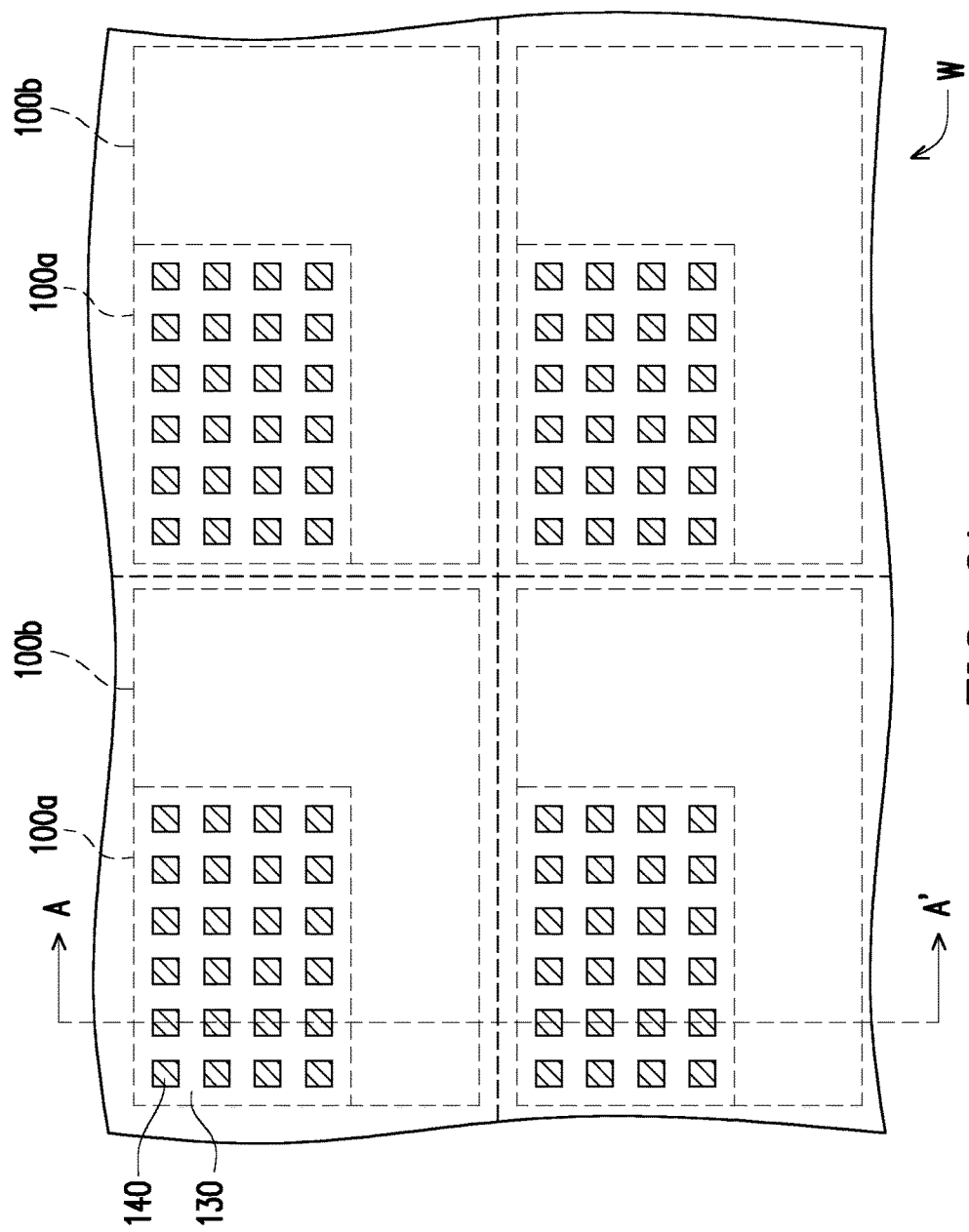
FIGS. 2A through 2G are plane views illustrating a process flow for fabricating optical transceivers in accordance with some embodiments of the present disclosure.
Figure 2B:
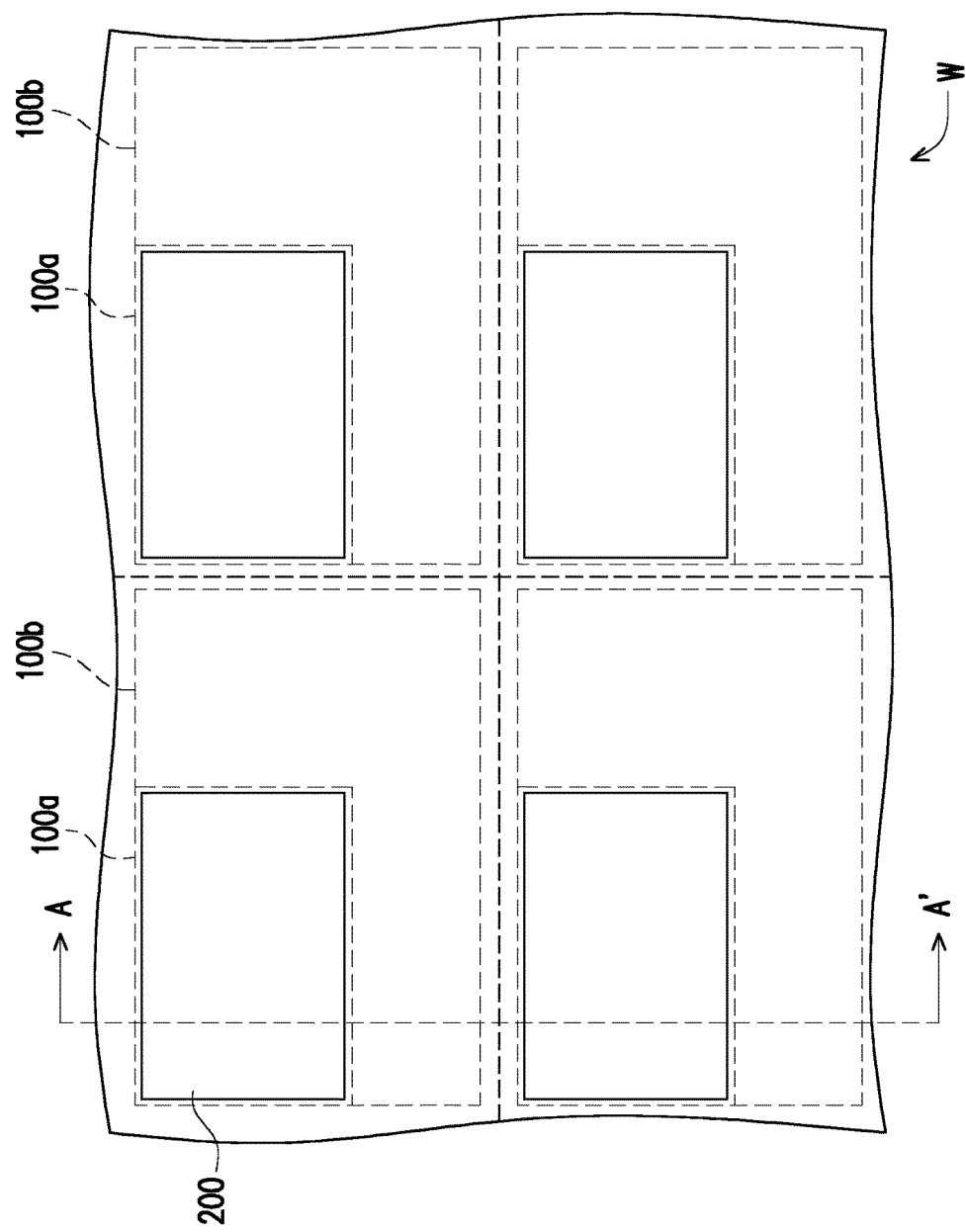
Figure 2C:
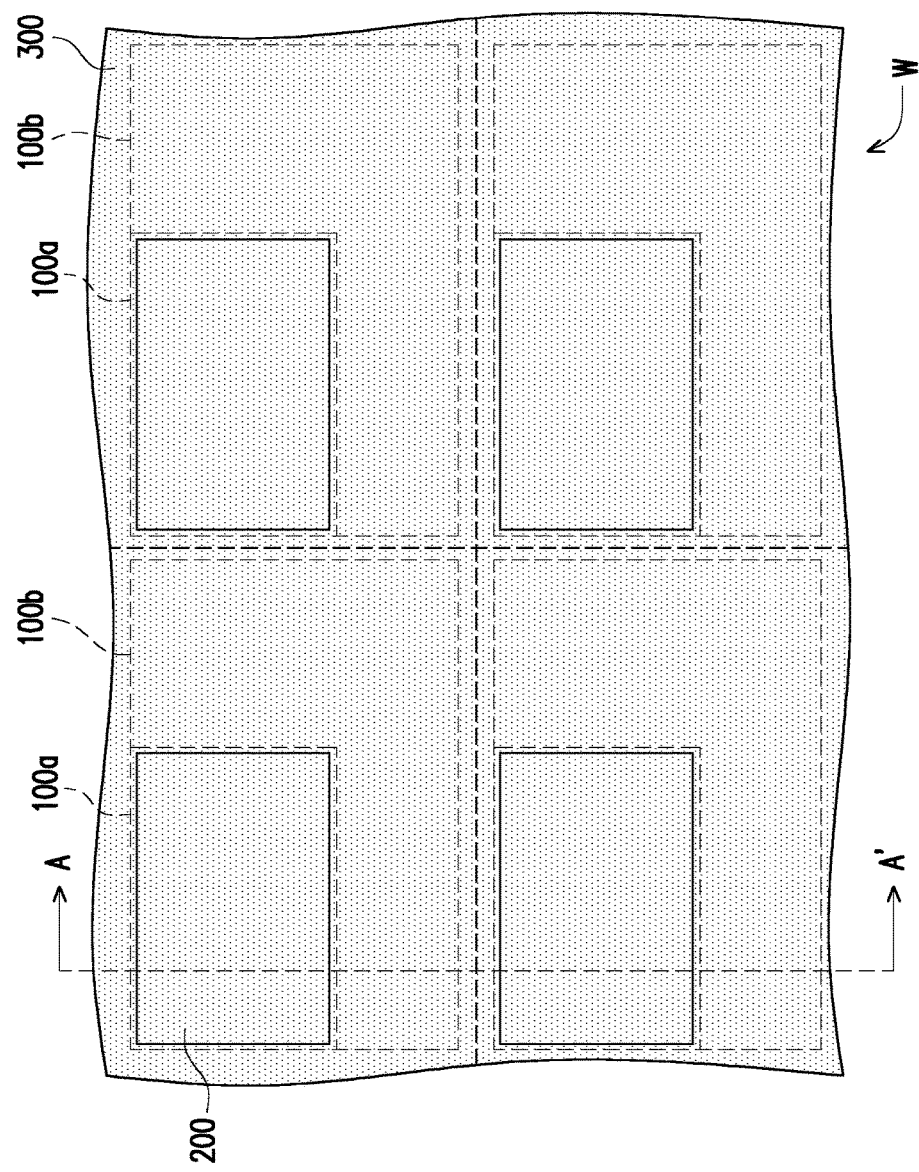
Figure 2D:
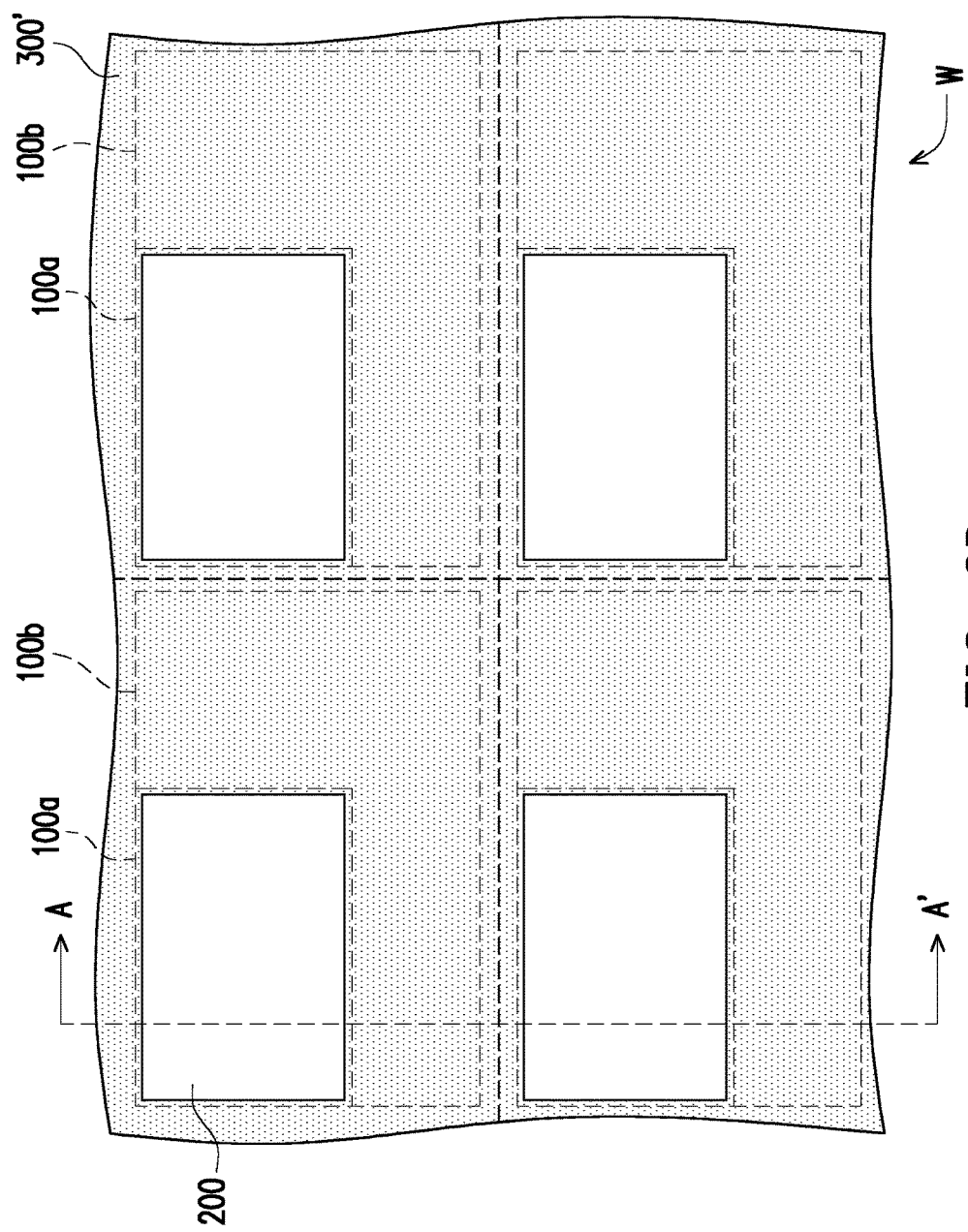
Figure 2E:
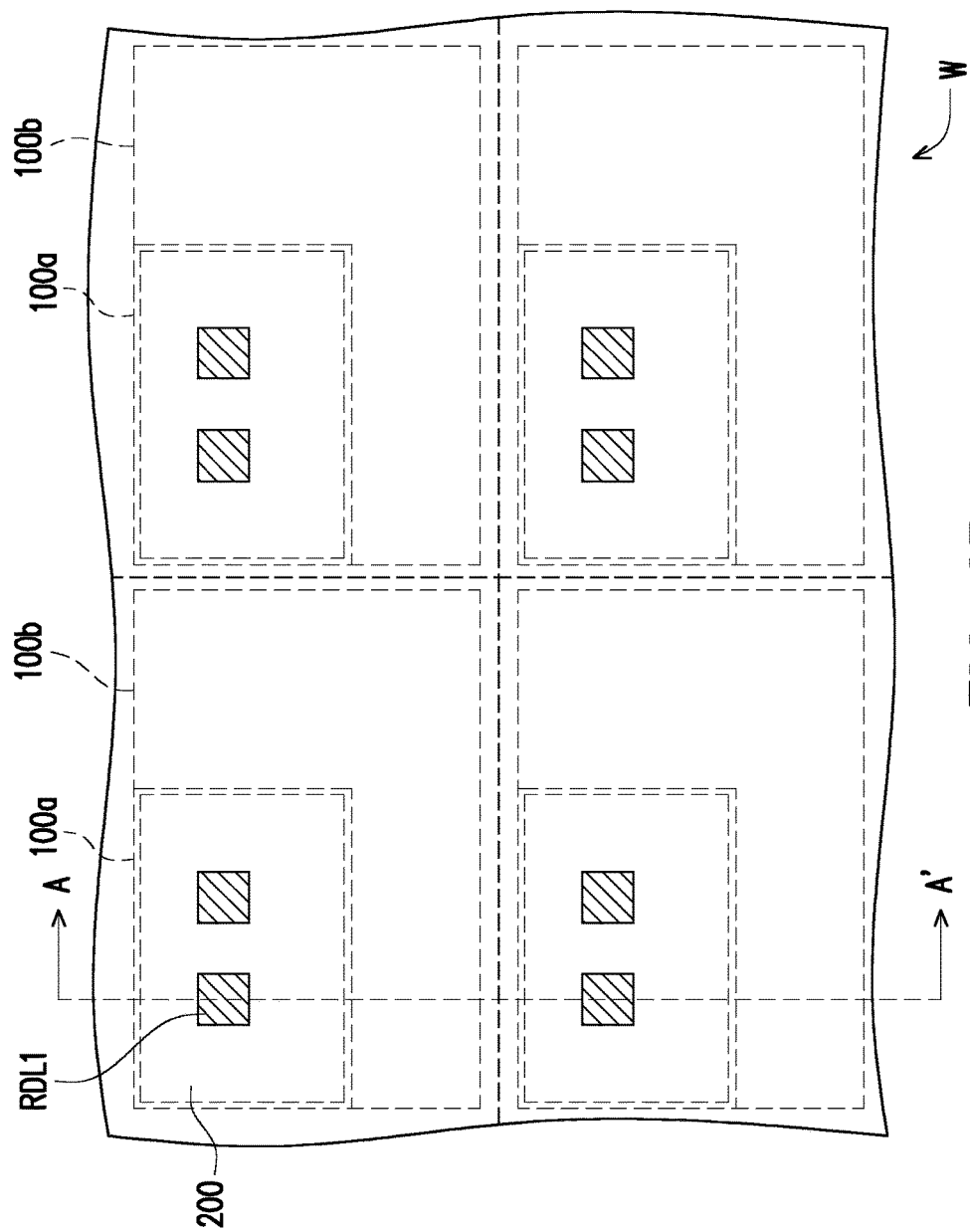
Figure 2F:
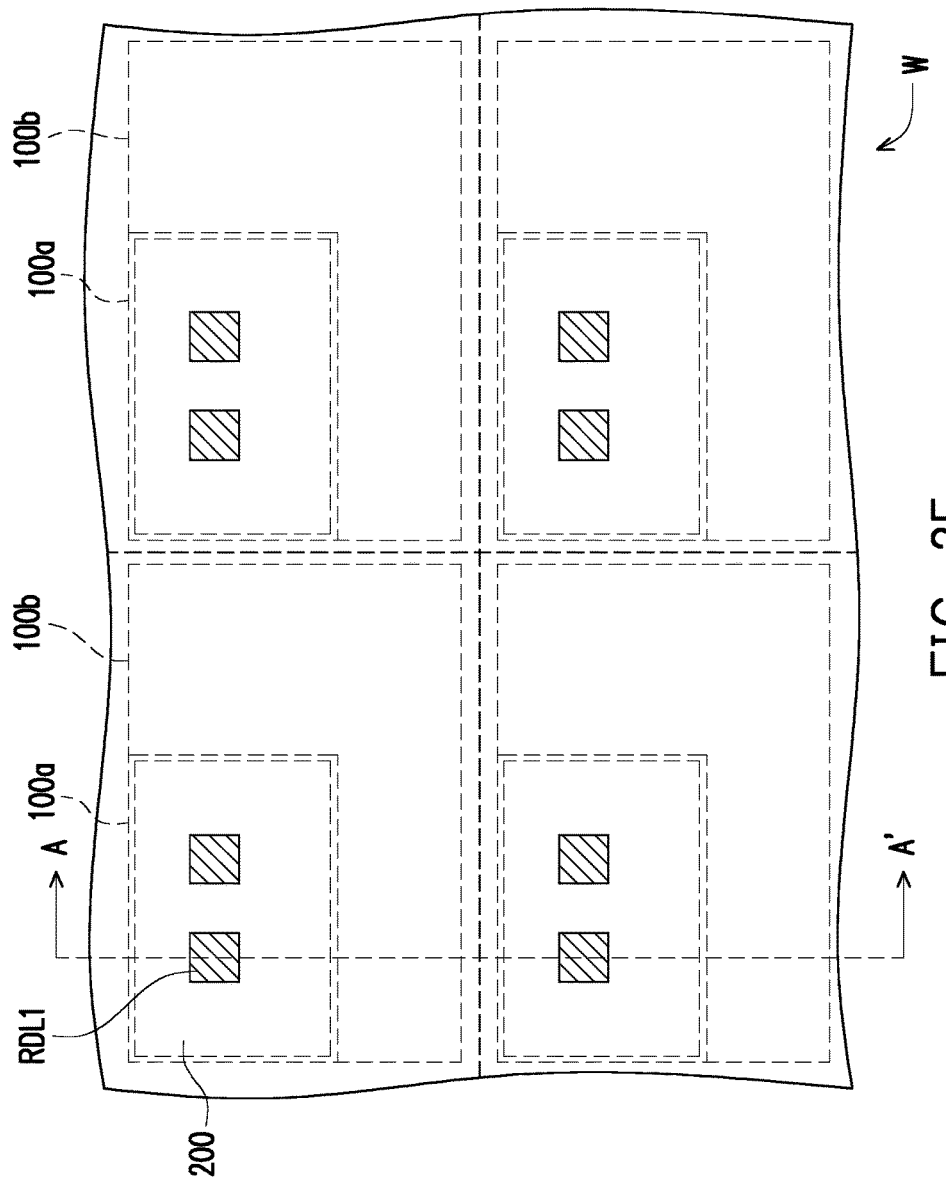
Figure 2G:
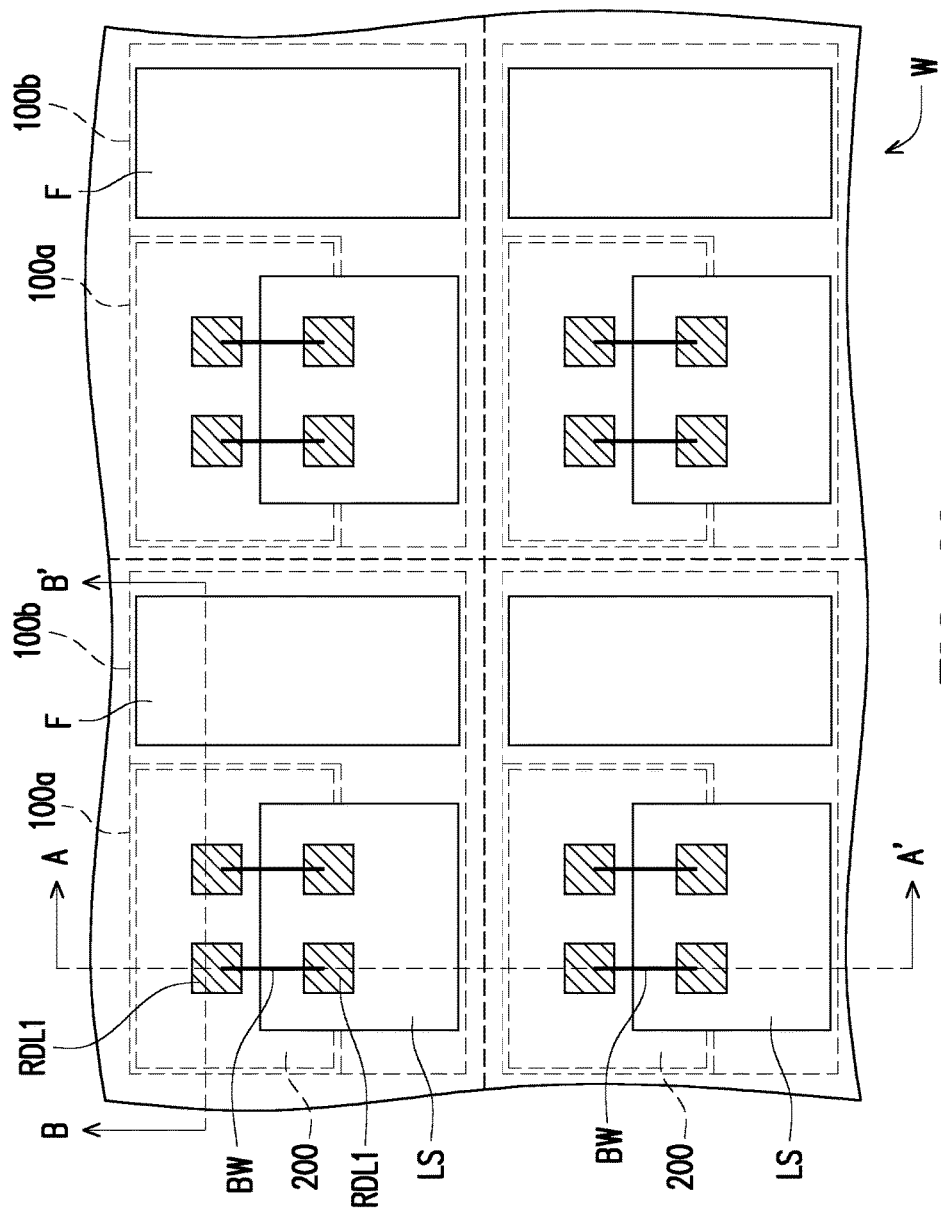
Figure 3:
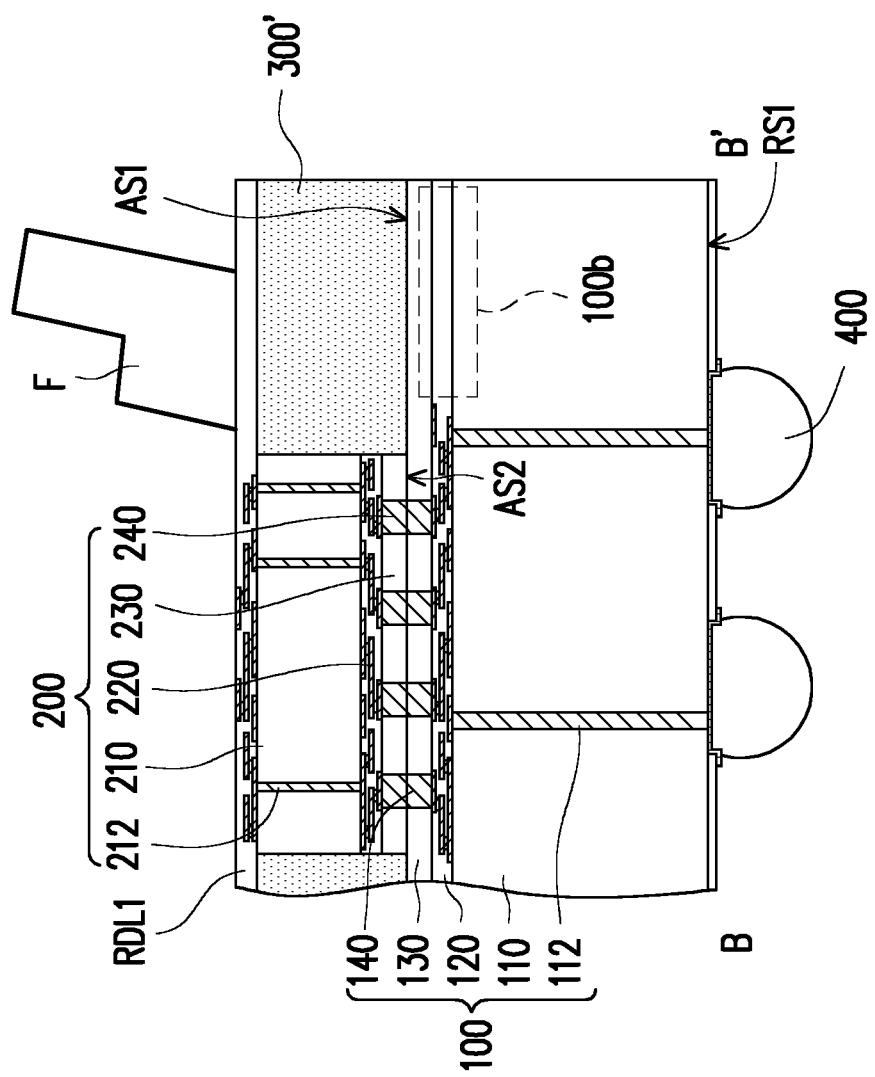
FIG. 3 is a cross-sectional view of an optical transceiver taken along the cross-section line B-B' as shown in FIG. 2G.
Figure 7A:
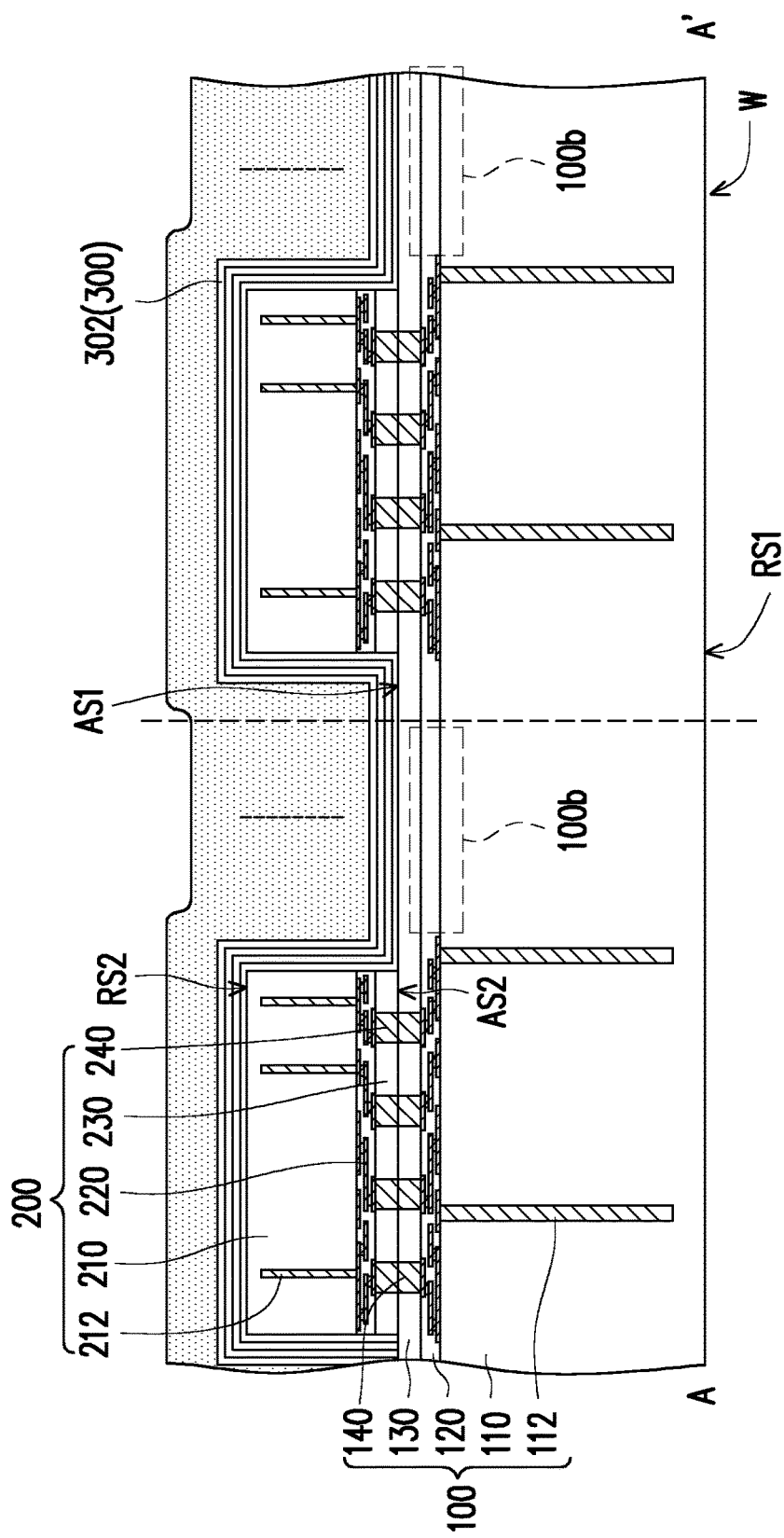
FIG. 7A and FIG. 7B are cross-sectional views illustrating the fabrication of the insulating encapsulant in accordance with some alternative embodiments of the present disclosure.
Figure 7B:
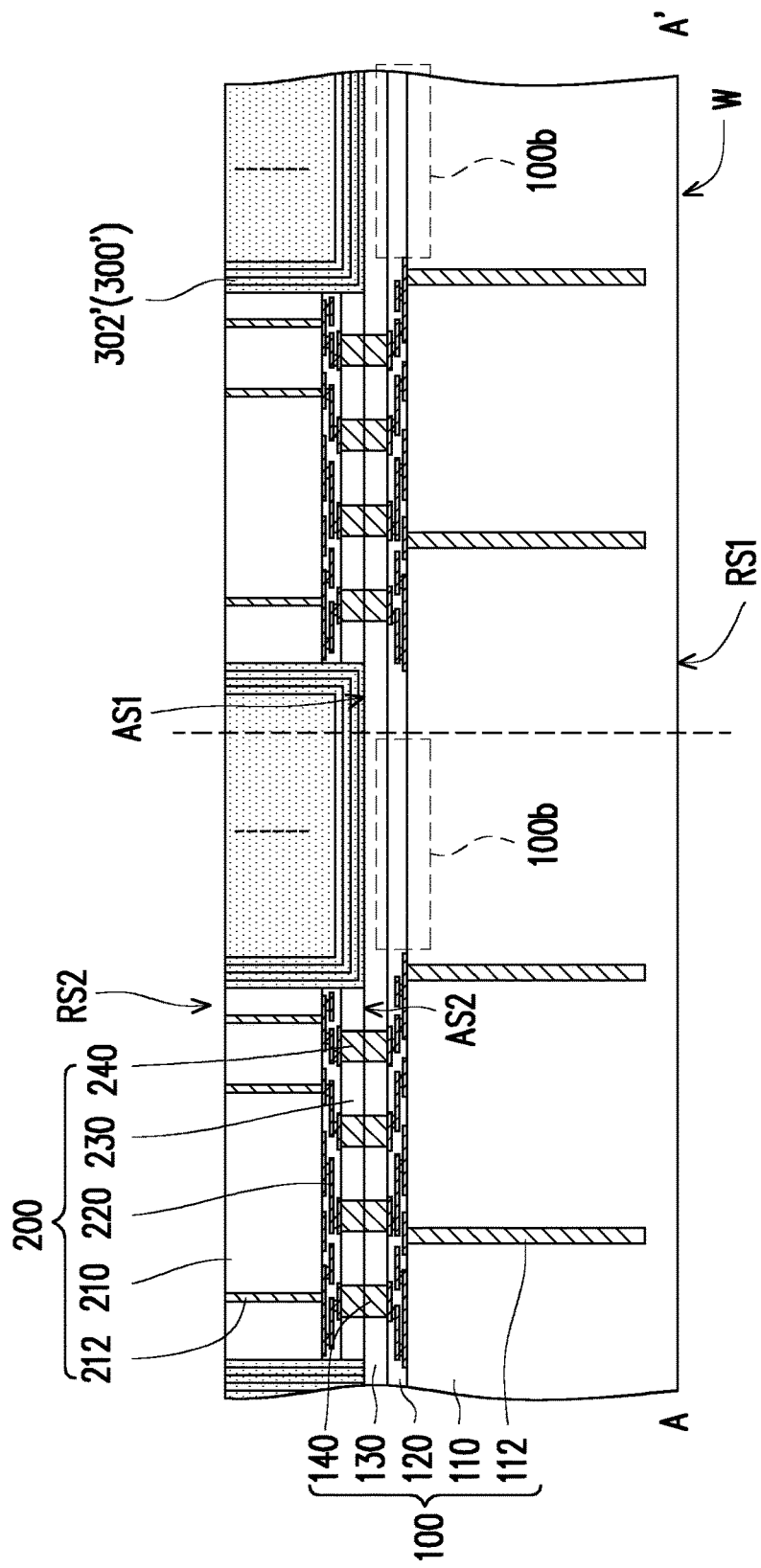

FIGS. 1A through 1H are cross-sectional views illustrating a process flow for fabricating optical transceivers taken along the cross-section line A-A' shown in FIG. 2G in accordance with some embodiments of the present disclosure. FIGS. 2A through 2G are plane views illustrating a process flow for fabricating optical transceivers in accordance with some embodiments of the present disclosure. The cross-sectional views illustrated in FIGS. 1A through 1H are taken along the cross-section line A-A' as shown in FIG. 2G. FIG. 3 is a cross-sectional view of an optical transceiver taken along the cross-section line B-B' as shown in FIG. 2G. FIG. 7A and FIG. 7B are cross-sectional views illustrating the fabrication of the insulating encapsulant in accordance with some alternative embodiments of the present disclosure.

Referring to FIG. 1A and FIG. 2A, a photonic wafer W including a plurality of photonic integrated circuit components 100 therein is provided. The photonic integrated circuit components 100 are arranged in array and physically connected to one another. Each one of the photonic integrated circuit components 100 respectively includes an electrical bonding portion 100a and at least one optical input/output portion 100b configured to transmit and receive optical signal. The optical signal is, for example, pulsed light, light with continuous wave (CW) or the combinations thereof. In some embodiments, the electrical bonding portions 100a of the photonic integrated circuit components 100 may include semiconductor devices (e.g., transistors, capacitors and so on), wirings or conductors for electrical connection, and the optical input/output portions 100b of the photonic integrated circuit components 100 may include semiconductor devices and optical devices for processing the optical signal. For example, the semiconductor devices formed in the optical input/output portions 100b may include transistors, capacitors, photodiodes or the combination thereof, and the optical devices formed in the optical input/output portions 100b may include modulators, grating coupler, edge coupler, waveguides, filters or the combination thereof. As shown in FIG. 1A, the photonic wafer W may include a first active surface AS1 and a first rear surface RS1 opposite to the first active surface AS1, wherein the electrical bonding portions 100a and the optical input/output portions 100b are located at the first active surface AS1 of the photonic wafer W.

The photonic wafer W may include a first semiconductor substrate 110 having a plurality of semiconductor devices and optical devices formed therein, a first interconnection structure 120 disposed on the first semiconductor substrate 110, a first dielectric layer 130 covering the first interconnection structure 120 and a plurality of first conductors 140. The first conductors 140 are embedded in the first dielectric layer 130. The first conductors 140 are electrically connected to the first semiconductor substrate 110 through the first interconnection structure 120. In some embodiments, the material of the first conductors 140 may be copper (Cu) or other suitable metallic material while the material of the first dielectric layer 130 may be silicon oxide ($SiO_x$, where x>0), silicon nitride ($SiN_x$, where x>0), silicon oxynitirde ($SiO_xN_y$, where x>0 and y>0) or other suitable dielectric material.

The first dielectric layer 130 may be formed by depositing a dielectric material layer on the first interconnection structure 120 and patterning the dielectric material layer to form a plurality of openings in the dielectric material layer. The openings formed in the first dielectric layer 130 expose portions of the first interconnection structure 120. After the first dielectric layer 130 is patterned, a conductive material layer may be deposited on the first dielectric layer 130 and the portions of the first interconnection structure 120 exposed by the openings of the first dielectric layer 130. Then, a polishing process (e.g., a chemical mechanical polishing process) is performed to partially remove the conductive material layer until the top surface of the first dielectric layer 130 is exposed. After performing the polishing process, the first conductors 140 are formed in the openings of the first dielectric layer 130. As shown in FIG. 1A, the top surfaces of the first conductors 140 and the top surface of the first dielectric layer 130 are substantially at the same level so as to provide an appropriate surface for hybrid bonding.

As shown in FIG. 1A, the photonic wafer W may further include a plurality of through semiconductor vias (TSV) 112 embedded in the first semiconductor substrate 110. The through semiconductor vias 112 are electrically connected to the first interconnection structure 120 and extend downward into the first semiconductor substrate 110 without penetrating the first semiconductor substrate 110. In other words, the through semiconductor vias 112 embedded in the first semiconductor substrate 110 are not exposed at the first rear surface RS1 of the photonic wafer W.

Referring to FIG. 1B and FIG. 2B, a plurality of electric integrated circuit components 200 are provided. Each one of the electric integrated circuit components 200 may respectively include a second semiconductor substrate 210 having a plurality of semiconductor devices formed therein, a second interconnection structure 220 disposed on the second semiconductor substrate 210, a second dielectric layer 230 covering the second interconnection structure 220 and a plurality of second conductors 240. The second conductors 240 are embedded in the second dielectric layer 230. The second conductors 240 are electrically connected to the second semiconductor substrate 210 through the second interconnection structure 220. In some embodiments, the material of the second conductors 240 may be copper (Cu) or other suitable metallic material while the material of the second dielectric layer 230 may be silicon oxide ($SiO_x$, where x>0), silicon nitride ($SiN_x$, where x>0), silicon oxynitirde ($SiO_xN_y$, where x>0 and y>0) or other suitable dielectric material.

As shown in FIG. 1B, each one of the electric integrated circuit components 200 may respectively include a second active surface AS2 and a second rear surface RS2 opposite to the second active surface AS2. In some embodiments, the electric integrated circuit component 200 may further include a plurality of through semiconductor vias (TSV) 212 embedded in the second semiconductor substrate 210. The through semiconductor vias 212 are electrically connected to the second interconnection structure 220 and extend into the second semiconductor substrate 210 without penetrating the second semiconductor substrate 210. In other words, the through semiconductor vias 212 embedded in the second semiconductor substrate 210 are not exposed at the second rear surface RS2 of the electric integrated circuit component 200.

The electric integrated circuit components 200 may be picked-up and placed onto the first active surface AS1 of the photonic wafer W such that the first active surface AS1 of the photonic wafer W is in contact with the second active surfaces AS2 of the electric integrated circuit components 200, and the second conductors 240 of the electric integrated circuit components 200 are substantially aligned and in contact with the first conductors 140 of the photonic integrated circuit components 100 in the photonic wafer W. The electric integrated circuit components 200 are picked-up and placed to cover the electrical bonding portions 100a of photonic integrated circuit components 100, and the optical input/output portions 100b of the photonic integrated circuit components 100 are not covered by the electric integrated circuit components 200. In some embodiments, after the electric integrated circuit components 200 are picked-up and placed on the photonic integrated circuit components 100, a grinding process may be performed to reduce the thickness of the electric integrated circuit components 200. The above-mentioned grinding process may be chemical mechanical polishing (CMP) process, a mechanical grinding process, the combination thereof or other suitable processes. After performing the grinding process of the electric integrated circuit components 200, the through semiconductor vias 212 embedded in the second semiconductor substrate 210 are not exposed at the second rear surface RS2 of the electric integrated circuit component 200. As shown in FIG. 2B, the electric integrated circuit components 200 placed on the photonic wafer W are arranged in array, for example.

In some embodiments, to facilitate the chip-to-wafer hybrid bonding between the electric integrated circuit components 200 and the photonic wafer W, surface preparation for bonding surfaces (i.e. the first active surface AS1 and the second active surface AS2) of the photonic wafer W and the electric integrated circuit components 200 may be performed. The surface preparation may include surface cleaning and activation, for example. Surface cleaning may be performed on the first active surface AS1 of the photonic wafer W and the second active surface AS2 of the electric integrated circuit components 200 so as to remove particles on top surfaces of the first conductors 140, the first dielectric layer 130, the second conductors 240 and the second dielectric layer 230. The first active surface AS1 of the photonic wafer W and the second active surface AS2 of the electric integrated circuit components 200 may be cleaned by wet cleaning, for example. Not only particles are removed, but also native oxide formed on the top surfaces of the first conductors 140 and the second conductors 240 may be removed. The native oxide formed on the top surfaces of the first conductors 140 and the second conductors 240 may be removed by chemicals used in the wet cleaning, for example.

After cleaning the first active surface AS1 of the photonic wafer W and the second active surface AS2 of the electric integrated circuit components 200, activation of the top surfaces of the first dielectric layer 130 and the second dielectric layer 230 may be performed for development of high bonding strength. In some embodiments, plasma activation may be performed to treat the top surfaces of the first dielectric layer 130 and the second dielectric layer 230.

When the activated top surface of the first dielectric layer 130 is in contact with the activated top surface of the second dielectric layer 230, the first dielectric layer 130 of the photonic wafer W and the second dielectric layer 230 of the electric integrated circuit components 200 are pre-bonded. In other words, the photonic wafer W and the electric integrated circuit components 200 are pre-bonded through the pre-bonding of the first dielectric layer 130 and the second dielectric layer 230. After the first dielectric layer 130 and the second dielectric layer 230 are pre-bonded, the first conductors 140 are in contact with and electrically connected to the second conductors 240.

After pre-bonding the electric integrated circuit components 200 onto the photonic wafer W, hybrid bonding of the electric integrated circuit components 200 and the photonic wafer W is performed. The hybrid bonding of the electric integrated circuit components 200 and the photonic wafer W may include a treatment for dielectric bonding and a thermal annealing for conductor bonding. In some embodiments, the treatment for dielectric bonding is performed to strengthen the bonding between the first dielectric layer 130 and the second dielectric layer 230. For example, the treatment for dielectric bonding may be performed at temperature ranging from about 100 Celsius degree to about 150 Celsius degree. After performing the treatment for dielectric bonding, the thermal annealing for conductor bonding is performed to facilitate the bonding between the first conductors 140 and the second conductors 240. For example, the thermal annealing for conductor bonding may be performed at temperature ranging from about 300 Celsius degree to about 400 Celsius degree. The process temperature of the thermal annealing for conductor bonding is higher than that of the treatment for dielectric bonding. After performing the thermal annealing for conductor bonding, the first dielectric layer 130 is bonded to the second dielectric layer 230 and the first conductors 140 are bonded to the second conductors 240. In some embodiments, the first conductors 140 may be conductive vias (e.g., copper vias), conductive pads (e.g., copper pads) or the combinations thereof while the second conductors 240 may be conductive vias (e.g., copper vias), conductive pads (e.g., copper pads) or the combinations thereof. For example, the conductor bonding between the first conductors 140 and the second conductors 240 may be via-to-via bonding, pad-to-pad bonding or via-to-pad bonding.

After performing the hybrid bonding of the electric integrated circuit component 200 and the photonic wafer W, the first interconnection structure 120 and the second interconnection structure 220 are electrically connected to each other through the first conductors 140 and the second conductors 240.

Referring to FIG. 1C and FIG. 2C, after performing the hybrid bonding of the electric integrated circuit components 200 and the photonic wafer W, an insulating material 300 is formed to cover the optical input/output portions 100b of the photonic wafer W and encapsulate the electric integrated circuit components 200. The maximum thickness of the insulating material 300 may be greater than the thickness of the electric integrated circuit components 200. In some embodiments, the insulating material 300 may be conformally formed by chemical vapor deposition (CVD), or other suitable deposition processes. Furthermore, the insulating material 300 is optically transparent to the optical signal to be processed by the optical input/output portions 100b of the photonic integrated circuit components 100.

In some embodiment, as shown in FIG. 1C, the insulating material 300 may be a single-layered structure and the material of the insulating material 300 may include silicon oxide, silicon nitride, and/or tetraethoxysilane (TEOS). In some alternative embodiments, as shown in FIG. 7A, the insulating material 300 may be a multi-layered structure and include a plurality of stacked dielectric layers 302, wherein the plurality of stacked dielectric layers 302 of the multi-layered insulating material 300 are optically transparent to the optical signal to be processed by the optical input/output portions 100b.

Referring to FIG. 1D and FIG. 2D, a grinding or polishing process is performed on the insulating material 300 so as to partially remove the insulating material 300 and the electric integrated circuit components 200 until the through semiconductor vias 212 and the rear surfaces RS2 of the electric integrated circuit components 200 are exposed. In some embodiments, the insulating material 300 and the electric integrated circuit components 200 may be partially removed by a chemical mechanical polishing (CMP) process, a mechanical grinding process, the combination thereof or other suitable removal processes. After performing the grinding or polishing process, an insulating encapsulant 300' is formed and the optical input/output portions 100b of the photonic integrated circuit components 100 are covered by the insulating encapsulant 300'. The electric integrated circuit component 200 is laterally encapsulated by the insulating encapsulant 300'. Furthermore, the insulating encapsulant 300' physically contacts the sidewalls of the electric integrated circuit components 200.

In some embodiments, as shown in FIG. 1D, the insulating encapsulant 300' may be a single-layered structure and the material of the insulating encapsulant 300' may include silicon oxide, silicon nitride, and/or tetraethoxysilane (TEOS). In some alternative embodiments, as shown in FIG. 7B, the insulating encapsulant 300' may be a multi-layered structure and include a plurality of stacked dielectric layers 302', wherein the plurality of stacked dielectric layers 302' of the multi-layered insulating encapsulant 300' are optically transparent to the optical signal to be processed by the optical input/output portions 100b. Furthermore, the stacked dielectric layers 302' may be formed from multiple layers of alternating dielectric materials (e.g., alternating silicon oxide/silicon nitride layers) with varying refractive index or thickness. The stacked dielectric layers 302' of the multi-layered insulating encapsulant 300' may provide anti-reflection effect.

Referring to FIG. 1E and FIG. 2E, after forming the insulating encapsulant 300', a redistribution circuit layer RDL1 is formed on the top surface of the insulating encapsulant 300' and the rear surfaces RS2 of the electric integrated circuit components 200. The redistribution circuit layer RDL1 is electrically connected to the through semiconductor vias 212. Furthermore, the redistribution circuit layer RDL1 may be electrically connected to the second interconnection structure 220 through the through semiconductor vias 212. Although the formation of the redistribution circuit layer RDL1 is illustrated in FIG. 1E and FIG. 2E, the formation of the redistribution circuit layer RDL1 may be omitted in accordance with some alternative embodiments.

As shown in FIG. 1E, in some embodiments, the redistribution circuit layer RDL1 may include conductive wirings and inter-dielectric layers stacked alternately, wherein the conductive wirings are distributed merely on the rear surfaces RS2 of the electric integrated circuit components 200, the inter-dielectric layers are distributed on the top surface of the insulating encapsulant 300' and the rear surfaces RS2 of the electric integrated circuit components 200, and the inter-dielectric layers are optically transparent to the optical signal to be processed by the optical input/output portions 100b. In some alternative embodiments, the redistribution circuit layer RDL1 may include conductive wirings distributed on the top surface of the insulating encapsulant 300' and the rear surfaces RS2 of the electric integrated circuit components 200. That is, portions of the conductive wirings in the redistribution circuit layer RDL1 may extend onto the top surface of the insulating encapsulant 300' as long as the optical signal to be processed by the optical input/output portions 100b is not shielded or blocked by the conductive wirings. However, the distribution of the conductive wirings in the redistribution circuit layer RDL1 is not limited in this disclosure.

Referring to FIG. 1E, FIG. 1F, FIG. 2E and FIG. 2F, a rear side grinding or polishing process is performed on the first rear surface RS1 of the photonic wafer W until the through semiconductor vias 112 are exposed at the first rear surface RS1. In some embodiments, the photonic wafer W may be thinned by a chemical mechanical polishing (CMP) process, a mechanical grinding process, the combination thereof or other suitable removal processes. Then, a plurality of conductive terminals 400 electrically connected to the through semiconductor vias 112 are formed on the first rear surface RS1 of the photonic wafer W. In some embodiments, the conductive terminals 400 are, for example, controlled collapse chip connection (C4) bumps, ball-grid array (BGA) balls or the like.

Referring to FIG. 1G, FIG. 2G and FIG. 3, after forming the conductive terminals 400, a plurality of light sources LS and a plurality of optical fiber adapters F are provided and installed onto the top surface of the redistribution circuit layer RDL1, wherein the light sources LS are electrically connected to the redistribution circuit layer RDL1 and are located above the optical input/output portions 100b of the photonic integrated circuit components 100, and the optical fiber adapters F are located above the optical input/output portions 100b. The optical fiber adapters F are suitable for adapting optical fibers (not shown). The light sources LS may be electrically controlled by the electric integrated circuit components 200 and emit optical signal to optically communicate with the photonic integrated circuit components 100, while the optical fiber adapters F may receive optical signal to optically communicate with the photonic integrated circuit components 100. In some embodiments, the light sources LS may be light-emitting diode (LED) packages capable of emitting the optical signal to be processed by the optical input/output portions 100b. For example, the light sources LS may be surface mount type LED packages capable of emitting the optical signal having wavelength about 1550 nm, vertical-cavity surface-emitting lasers (VCSELs) capable of emitting the optical signal having wavelength about 850 nm, distributed feedback (DFB) lasers capable of emitting the optical signal having wavelength about 1330 nm, or other types of lasers which are capable of emitting the optical signal having wavelength about 1330 nm. Furthermore, the light sources LS are, for example, electrically connected to the redistribution circuit layer RDL1 through bonding wires BW (e.g., gold wires formed by wire bonder).

As shown in FIG. 1G, FIG. 2G and FIG. 3, the light sources LS and the optical fiber adapters F are located above the insulating encapsulant 300' and the optical input/output portions 100b. In other words, the insulating encapsulant 300' is located at the light propagation path between the light sources LS and the optical input/output portions 100b as well as located at the light propagation path between the optical fiber adapters F and the optical input/output portions 100b. The insulating encapsulant 300' not only protects the electric integrated circuit components 200 from damage, but also serves as a light-guide for guiding the optical signal to be processed by the optical input/output portions 100b. Since the insulating encapsulant 300' for encapsulating the electric integrated circuit components 200 is optically transparent, the process window for mounting the light sources LS and the optical fiber adapters F onto the redistribution circuit layer RDL1 is large.

Referring to FIG. 1G, FIG. 1H and FIG. 2G, after the installation of the light sources LS and the optical fiber adapters F, a singulation process is performed along the scribe line SL such that a plurality of singulated optical transceivers OTC are formed. In some embodiments, the singulated optical transceivers OTC may be further mounted onto a package substrate (not shown), and the package substrate may be a printed circuit board, an interposer (e.g., a silicon interposer including through silicon vias) and so on. As illustrated in FIG. 1F and FIG. 1G, the installation of the light sources LS and the optical fiber adapters F is performed before the singulation process for forming the singulated optical transceivers OTC, however, the invention is not limited thereto. In some alternative embodiments, the installation of the light sources LS and the optical fiber adapters F may be performed after the singulation process.

As shown in FIG. 1H, the optical transceiver OTC include the photonic integrated circuit component 100, the electric integrated circuit component 200, the insulating encapsulant 300' and the redistribution circuit layer RDL1. The photonic integrated circuit component 100 includes the electrical bonding portion 100a and at least one optical input/output portion 100b configured to transmit and receive the optical signal. The electric integrated circuit component 200 is disposed on the electrical bonding portion 100a of the photonic integrated circuit component 100 and is electrically connected to the photonic integrated circuit component 100. For example, the electric integrated circuit component 200 is hybrid bonded with the photonic integrated circuit component 100. The insulating encapsulant 300' is disposed on the optical input/output portion 100b of the photonic integrated circuit component 100. The electric integrated circuit component 200 is laterally encapsulated by and embedded in the insulating encapsulant 300'. For example, the insulating encapsulant 300' physically contacts sidewalls of the electric integrated circuit component 200. In some embodiments, the insulating encapsulant 300' may include stacked dielectric layers which are optically transparent to the optical signal. The insulating encapsulant 300' is optically transparent to the optical signal. The redistribution circuit layer RDL1 is disposed on the electric integrated circuit component 200 and the insulating encapsulant 300'. The redistribution circuit layer RDL1 is electrically connected to the through semiconductor vias 212 of the electric integrated circuit component 200.

Figure 4:
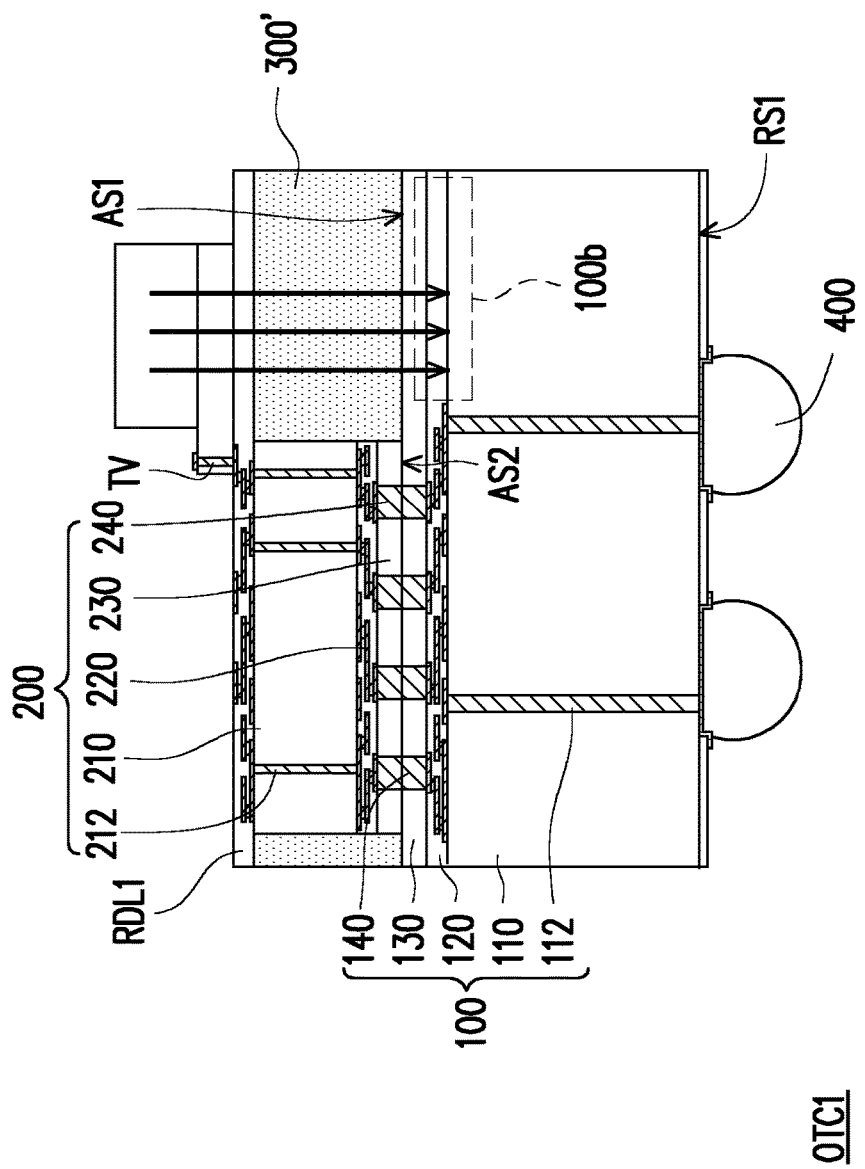
FIGS. 4 through 6 are cross-sectional views illustrating various optical transceivers in accordance with some alternative embodiments of the present disclosure.
Figure 5:
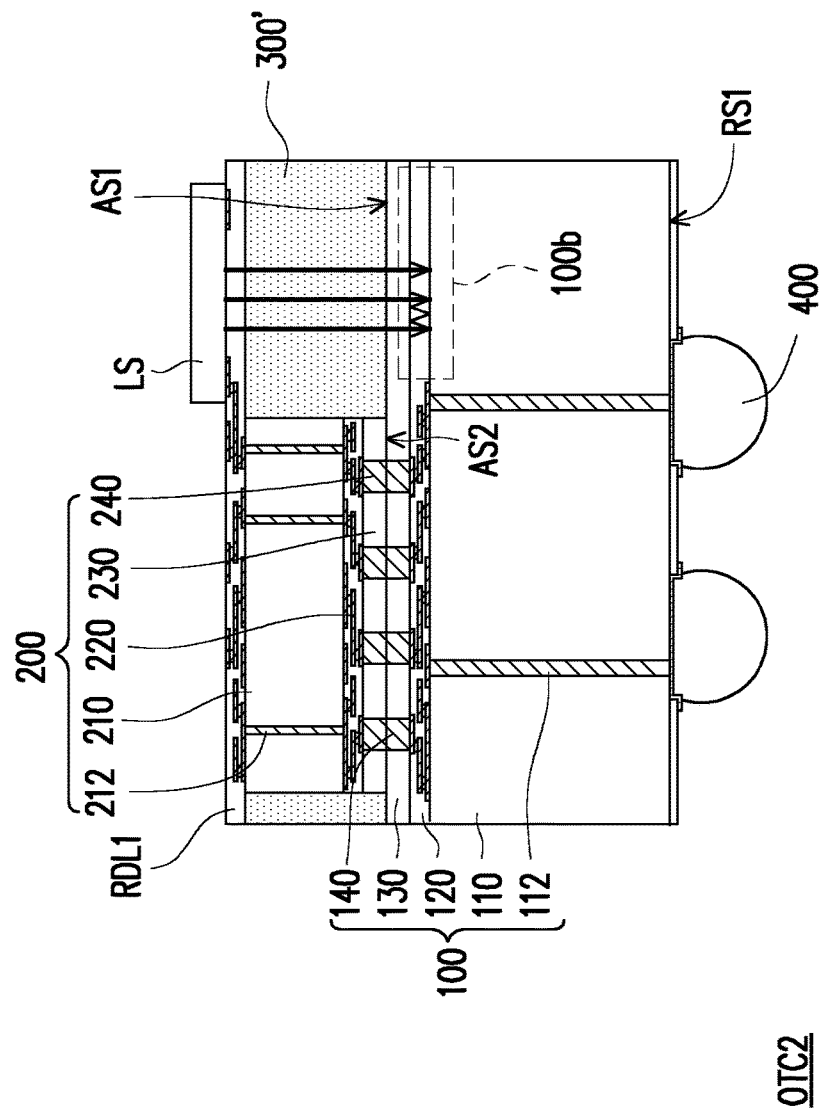
Figure 6:
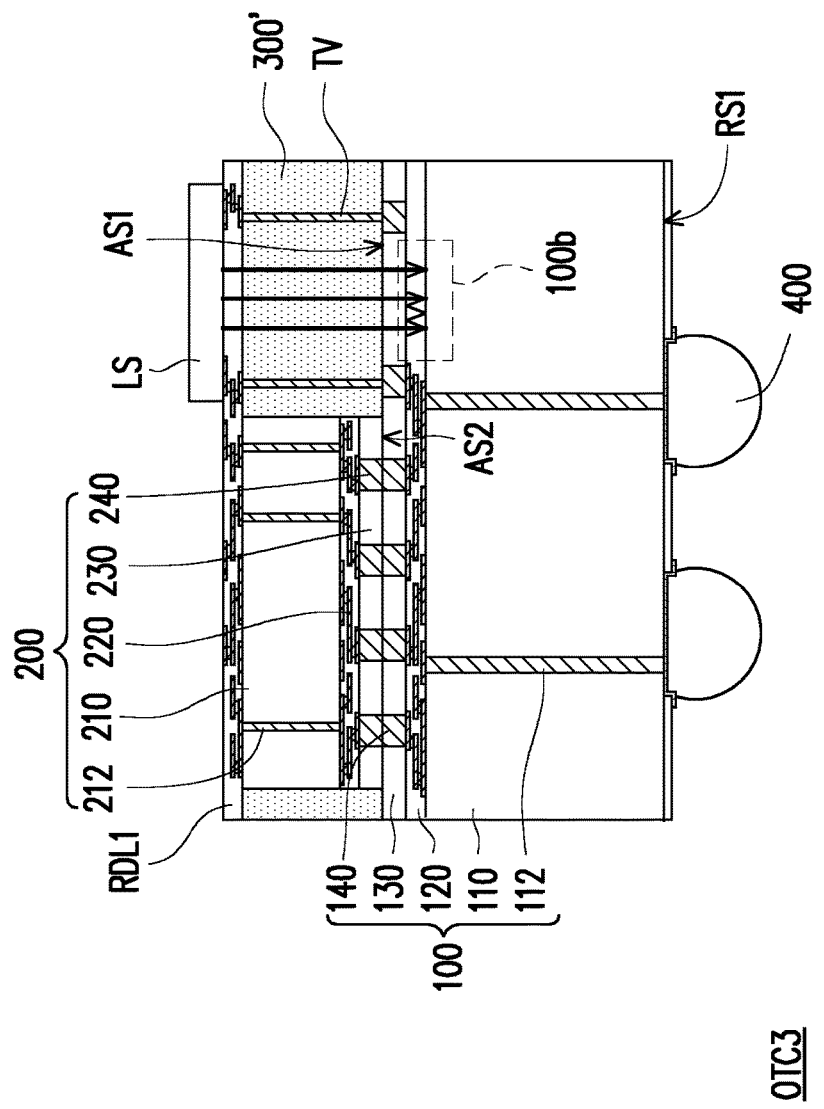

FIGS. 4 through 6 are cross-sectional views illustrating various optical transceivers in accordance with some alternative embodiments of the present disclosure.

Referring to FIG. 1H and FIG. 4, the optical transceiver OTC1 illustrated in FIG. 4 is similar with the optical transceiver OTC illustrated in FIG. 1H except that the light source LS in the optical transceiver OTC1 is electrically connected to the redistribution circuit layer RDL1 through at least one conductive through via TV formed in the light source LS.

Referring to FIG. 1H and FIG. 5, the optical transceiver OTC2 illustrated in FIG. 5 is similar with the optical transceiver OTC illustrated in FIG. 1H except that the light source LS in the optical transceiver OTC2 is a light-emitting diode (LED) chip capable of emitting the optical signal to be processed by the optical input/output portions 100b. For example, the light source LS may be an LED chip capable of emitting the optical signal having wavelength about 1550 nm. Furthermore, the light source LS (i.e. the LED chip) is, for example, electrically connected to the redistribution circuit layer RDL1 through flip-chip bonding technology. As shown in FIG. 5, portions of the conductive wirings in the redistribution circuit layer RDL1 may extend onto the top surface of the insulating encapsulant 300' as long as the optical signal to be processed by the optical input/output portions 100b is not shielded or blocked by the conductive wirings.

Referring to FIG. 5 and FIG. 6, the optical transceiver OTC3 illustrated in FIG. 6 is similar with the optical transceiver OTC2 illustrated in FIG. 5 except for the layout design of the redistribution circuit layer RDL1, the layout design of the first conductors 140 and through insulator vias TIV formed in the insulating encapsulant 300'. As shown in FIG. 6, the light source LS (i.e. the LED chip) is, for example, electrically connected to the first interconnection structure 120 through the redistribution circuit layer RDL1, through insulator vias TIV and the first conductors 140.

As shown in FIG. 6, portions of the conductive wirings in the redistribution circuit layer RDL1 may extend onto the top surface of the insulating encapsulant 300' as long as the optical signal to be processed by the optical input/output portions 100b is not shielded or blocked by the conductive wirings. Portions of the first conductors 140 may be distributed to contact the bottom surface of the insulating encapsulant 300' as long as the optical signal to be processed by the optical input/output portions 100b is not shielded or blocked by the first conductors 140. The through insulator vias TIV may be formed in the insulating encapsulant 300' as long as the optical signal to be processed by the optical input/output portions 100b is not shielded or blocked by the through insulator vias TIV. In addition, portions of wirings in the first interconnection structure 120 may be distributed to contact the bottom surface of the insulating encapsulant 300' as long as the optical signal to be processed by the optical input/output portions 100b is not shielded or blocked by the first interconnection structure 120.

FIGS. 8A through 8F are cross-sectional views illustrating another process flow for fabricating optical transceivers in accordance with some alternative embodiments of the present disclosure.

Figure 8A:
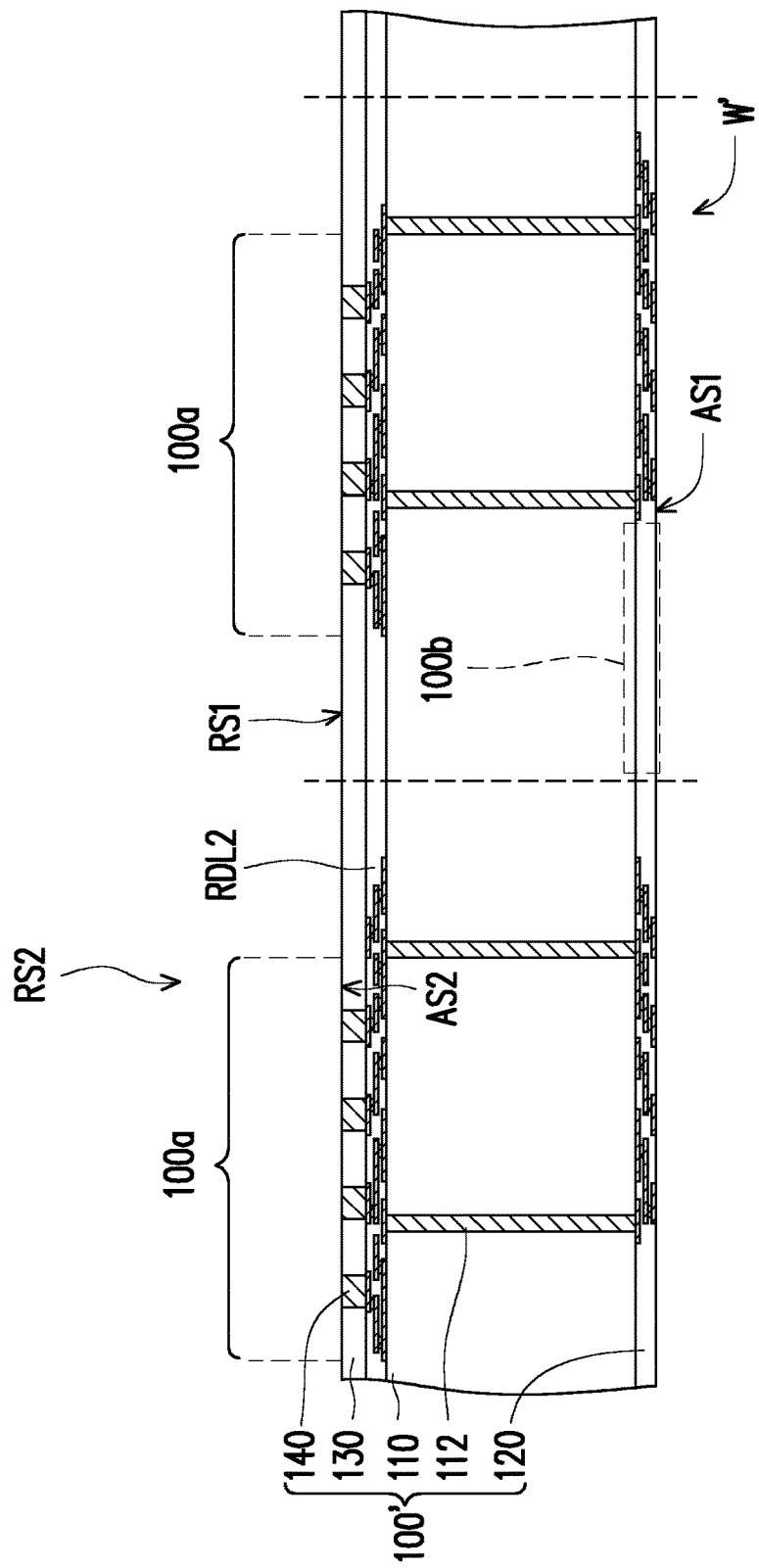
FIGS. 8A through 8F are cross-sectional views illustrating another process flow for fabricating optical transceivers in accordance with some alternative embodiments of the present disclosure.

Referring to FIG. 8A, a photonic wafer W' including a plurality of photonic integrated circuit components 100' therein is provided. The photonic integrated circuit components 100' are arranged in array and physically connected to one another. Each one of the photonic integrated circuit components 100' respectively includes an electrical bonding portion 100a and at least one optical input/output portion 100b configured to transmit and receive optical signal. The optical signal is, for example, pulsed light, light with continuous wave (CW) or the combinations thereof. In some embodiments, the electrical bonding portions 100a of the photonic integrated circuit components 100' may include wirings or conductors for electrical connection, and the optical input/output portions 100b of the photonic integrated circuit components 100' may include semiconductor devices and optical devices for processing optical signal. For example, the semiconductor devices formed in the optical input/output portions 100b may include transistors, capacitors, photodiodes or the combinations thereof, and the optical devices formed in the optical input/output portions 100b may include waveguides, filters or the combination thereof. As shown in FIG. 8A, the photonic wafer W' may include a first active surface AS1 and a first rear surface RS1 opposite to the first active surface AS1, wherein the electrical bonding portions 100a are located at the first rear surface RS1 of the photonic wafer W' and the optical input/output portions 100b are located at the first active surface AS1 of the photonic wafer W'. In other words, the electrical bonding portions 100a and the optical input/output portions 100b are located at opposite surfaces AS1 and RS1 of the photonic wafer W'.

The photonic wafer W' may include a first semiconductor substrate 110 having a plurality of semiconductor devices and optical devices formed therein, a first interconnection structure 120 disposed on one surface (e.g., the bottom surface) of the first semiconductor substrate 110, a redistribution circuit layer RDL2 disposed on another surface (e.g., the top surface) of the first semiconductor substrate 110, a first dielectric layer 130 covering the redistribution circuit layer RDL2 and a plurality of first conductors 140. The first conductors 140 are embedded in the first dielectric layer 130. The first conductors 140 are electrically connected to the redistribution circuit layer RDL2. In some embodiments, the material of the first conductors 140 may be copper (Cu) or other suitable metallic material while the material of the first dielectric layer 130 may be silicon oxide ($SiO_x$, where x>0), silicon nitride ($SiN_x$, where x>0), silicon oxynitirde ($SiO_xN_y$, where x>0 and y>0) or other suitable dielectric material.

As shown in FIG. 8A, the photonic wafer W' may further include a plurality of through semiconductor vias (TSV) 112 embedded in the first semiconductor substrate 110. The through semiconductor vias 112 penetrate the first semiconductor substrate 110 so as to electrically connect the first interconnection structure 120 and the redistribution circuit layer RDL2 formed on the top surface of the first semiconductor substrate 110. In some embodiments, the redistribution circuit layer RDL2 may include conductive wirings and inter-dielectric layers stacked alternately. The distribution of the conductive wirings in the redistribution circuit layer RDL2 is not limited in this disclosure.

The first dielectric layer 130 may be formed by depositing a dielectric material layer on the redistribution circuit layer RDL2 and patterning the dielectric material layer to form a plurality of openings in the dielectric material layer. The openings formed in the first dielectric layer 130 expose portions of the redistribution circuit layer RDL2. After the first dielectric layer 130 is patterned, a conductive material layer may be deposited on the first dielectric layer 130 and the portions of the redistribution circuit layer RDL2 exposed by the openings of the first dielectric layer 130. Then, a polishing process (e.g., a chemical mechanical polishing process) is performed to partially remove the conductive material layer until the top surface of the first dielectric layer 130 is exposed. After performing the polishing process, the first conductors 140 are formed in the openings of the first dielectric layer 130. As shown in FIG. 8A, the top surfaces of the first conductors 140 and the top surface of the first dielectric layer 130 are substantially at the same level so as to provide an appropriate surface for hybrid bonding.

Figure 8B:
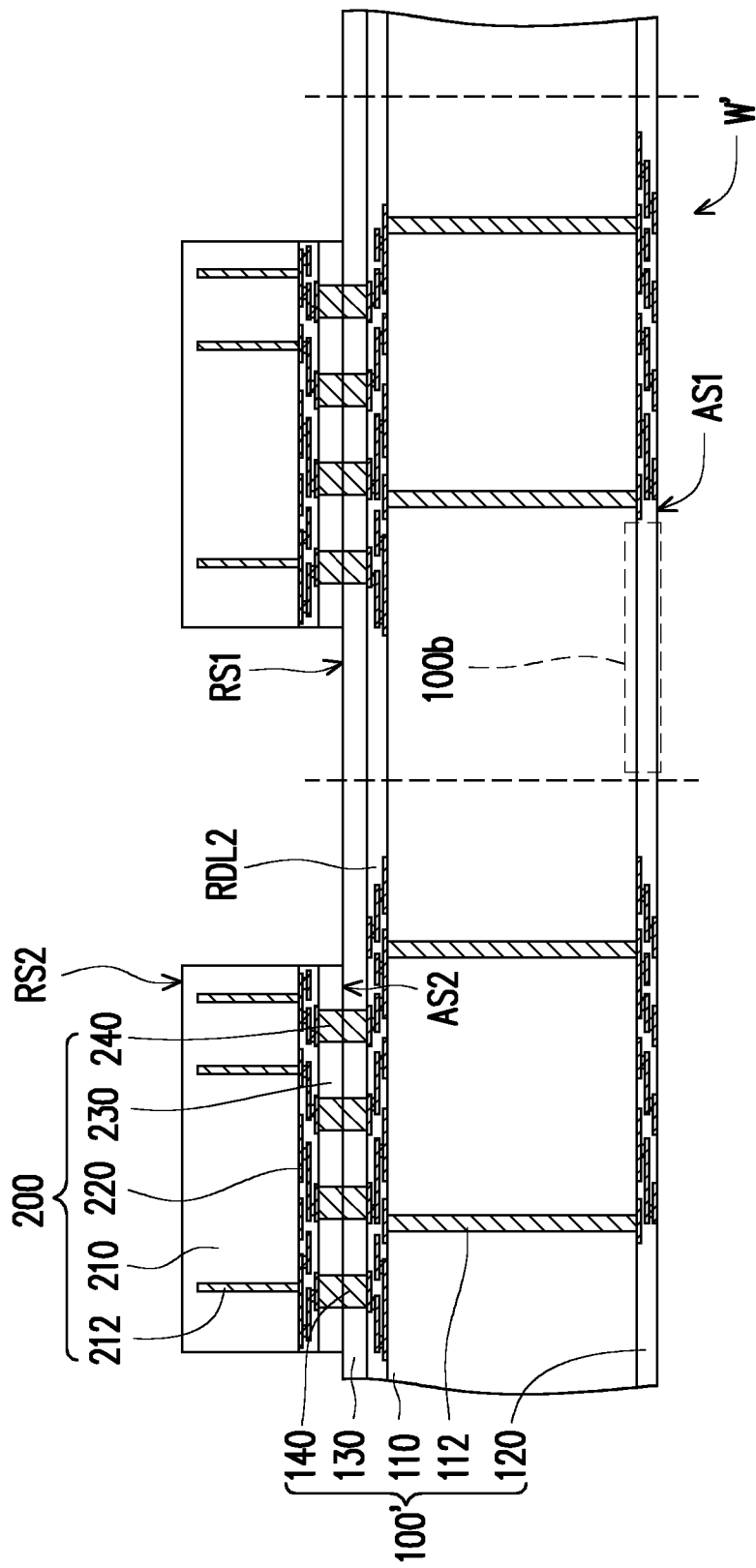

Referring to FIG. 8B, a plurality of electric integrated circuit components 200 are provided. Each one of the electric integrated circuit components 200 may respectively include a second semiconductor substrate 210 having a plurality of semiconductor devices formed therein, a second interconnection structure 220 disposed on the second semiconductor substrate 210, a second dielectric layer 230 covering the second interconnection structure 220 and a plurality of second conductors 240. The second conductors 240 are embedded in the second dielectric layer 230. The second conductors 240 are electrically connected to the second semiconductor substrate 210 through the second interconnection structure 220. In some embodiments, the material of the second conductors 240 may be copper (Cu) or other suitable metallic material while the material of the second dielectric layer 230 may be silicon oxide ($SiO_x$, where x>0), silicon nitride ($SiN_x$, where x>0), silicon oxynitirde ($Si-O_xN_y$, where x>0 and y>0) or other suitable dielectric material.

As shown in FIG. 8B, each one of the electric integrated circuit components 200 may respectively include a second active surface AS2 and a second rear surface RS2 opposite to the second active surface AS2. In some embodiments, the electric integrated circuit component 200 may further include a plurality of through semiconductor vias (TSV) 212 embedded in the second semiconductor substrate 210. The through semiconductor vias 212 are electrically connected to the second interconnection structure 220 and extend into the second semiconductor substrate 210 without penetrating the second semiconductor substrate 210. In other words, the through semiconductor vias 212 embedded in the second semiconductor substrate 210 are not exposed at the second rear surface RS2 of the electric integrated circuit component 200.

The electric integrated circuit components 200 may be picked-up and placed onto the first rear surface RS1 of the photonic wafer W such that the first rear surface RS1 of the photonic wafer W is in contact with the second active surfaces AS2 of the electric integrated circuit components 200, and the second conductors 240 of the electric integrated circuit components 200 are substantially aligned with the first conductors 140 of the photonic integrated circuit components 100' in the photonic wafer W. The electric integrated circuit components 200 are picked-up and placed to cover the electrical bonding portions 100a of photonic integrated circuit components 100'. In some embodiments, the electric integrated circuit components 200 placed onto the photonic wafer W' are arranged in array, for example.

In some embodiments, to facilitate the chip-to-wafer hybrid bonding, surface preparation for bonding surfaces (i.e. the rear active surface RS1 and the second active surface AS2) of the photonic wafer W' and the electric integrated circuit components 200 may be performed. The surface preparation may include surface cleaning and activation, for example. Surface cleaning may be performed on the first rear surface RS1 of the photonic wafer W' and the second active surface AS2 of the electric integrated circuit components 200 so as to remove particles on top surfaces of the first conductors 140, the first dielectric layer 130, the second conductors 240 and the second dielectric layer 230. The first rear surface RS1 of the photonic wafer W' and the second active surface AS2 of the electric integrated circuit components 200 may be cleaned by wet cleaning, for example. Not only particles are removed, but also native oxide formed on the top surfaces of the first conductors 140 and the second conductors 240 may be removed. The native oxide formed on the top surfaces of the first conductors 140 and the second conductors 240 may be removed by chemicals used in the wet cleaning, for example.

After cleaning the first rear surface RS1 of the photonic wafer W' and the second active surface AS2 of the electric integrated circuit components 200, activation of the top surfaces of the first dielectric layer 130 and the second dielectric layer 230 may be performed for development of high bonding strength. In some embodiments, plasma activation may be performed to treat the top surfaces of the first dielectric layer 130 and the second dielectric layer 230.

When the activated top surface of the first dielectric layer 130 is in contact with the activated top surface of the second dielectric layer 230, the first dielectric layer 130 of the photonic wafer W' and the second dielectric layer 230 of the electric integrated circuit components 200 are pre-bonded. In other words, the photonic wafer W' and the electric integrated circuit components 200 are pre-bonded through the pre-bonding of the first dielectric layer 130 and the second dielectric layer 230. After the pre-bonding of the first dielectric layer 130 and the second dielectric layer 230, the first conductors 140 are in contact with and electrically connected to the second conductors 240.

After pre-bonding the electric integrated circuit components 200 onto the photonic wafer W', a hybrid bonding of the electric integrated circuit components 200 and the photonic wafer W' is performed. The hybrid bonding of the electric integrated circuit components 200 and the photonic wafer W' may include a treatment for dielectric bonding and a thermal annealing for conductor bonding. In some embodiments, the treatment for dielectric bonding is performed to strengthen the bonding between the first dielectric layer 130 and the second dielectric layer 230. For example, the treatment for dielectric bonding may be performed at temperature ranging from about 100 Celsius degree to about 150 Celsius degree. After performing the treatment for dielectric bonding, the thermal annealing for conductor bonding is performed to facilitate the bonding between the first conductors 140 and the second conductors 240. For example, the thermal annealing for conductor bonding may be performed at temperature ranging from about 300 Celsius degree to about 400 Celsius degree. The process temperature of the thermal annealing for conductor bonding is higher than that of the treatment for dielectric bonding. After performing the thermal annealing for conductor bonding, the first dielectric layer 130 is bonded to the second dielectric layer 230 and the first conductors 140 are bonded to the second conductors 240. In some embodiments, the first conductors 140 may be conductive vias (e.g., copper vias), conductive pads (e.g., copper pads) or the combinations thereof while the second conductors 240 may be conductive vias (e.g., copper vias), conductive pads (e.g., copper pads) or the combinations thereof. For example, the conductor bonding between the first conductors 140 and the second conductors 240 may be via-to-via bonding, pad-to-pad bonding or via-to-pad bonding.

After performing the hybrid bonding of the electric integrated circuit component 200 and the photonic wafer W', the redistribution circuit layer RDL2 and the second interconnection structure 220 are electrically connected to each other through the first conductors 140 and the second conductors 240.

Figure 8C:
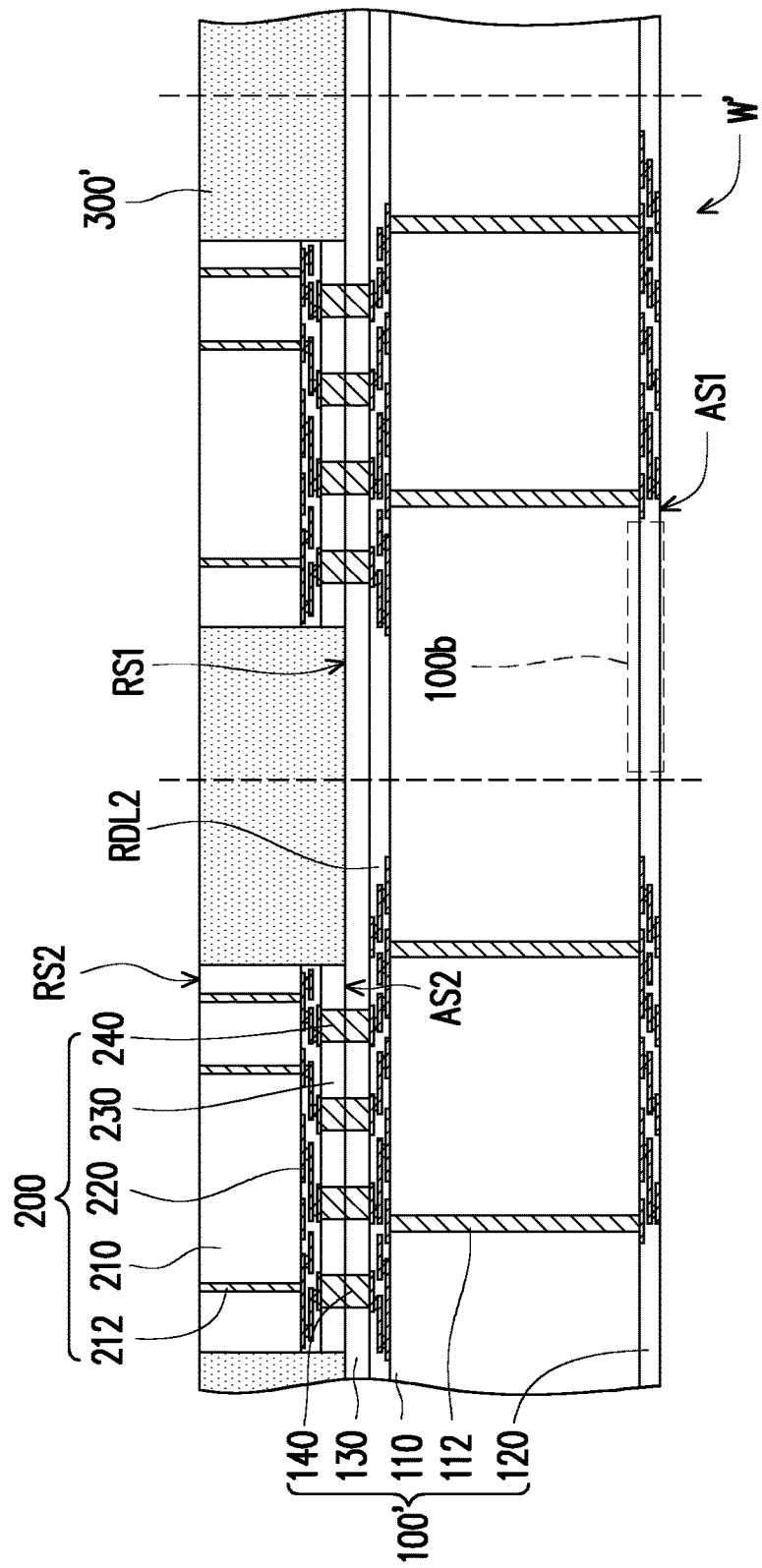

Referring to FIG. 8C, after performing the hybrid bonding of the electric integrated circuit components 200 and the photonic wafer W', an insulating encapsulant 300' is formed on the first rear surface RS1 of the photonic wafer W' so as to laterally encapsulate the electric integrated circuit components 200. The insulating encapsulant 300' may physically contact the sidewalls of the electric integrated circuit components 200. The insulating encapsulant 300' may be formed by molding process, chemical vapor deposition (CVD) followed by chemical mechanical polishing (CMP) process, or other suitable processes.

In some embodiments, the insulating encapsulant 300' may be optically transparent. For example, the encapsulant 300' may be a single-layered structure and the material of the insulating material may include silicon oxide, silicon nitride, and/or tetraethoxysilane (TEOS). In some alternative embodiments, the insulating encapsulant 300' may be optically opaque. For example, the material of the insulating encapsulant 300' may be epoxy resin or other suitable molding compound.

Figure 8D:
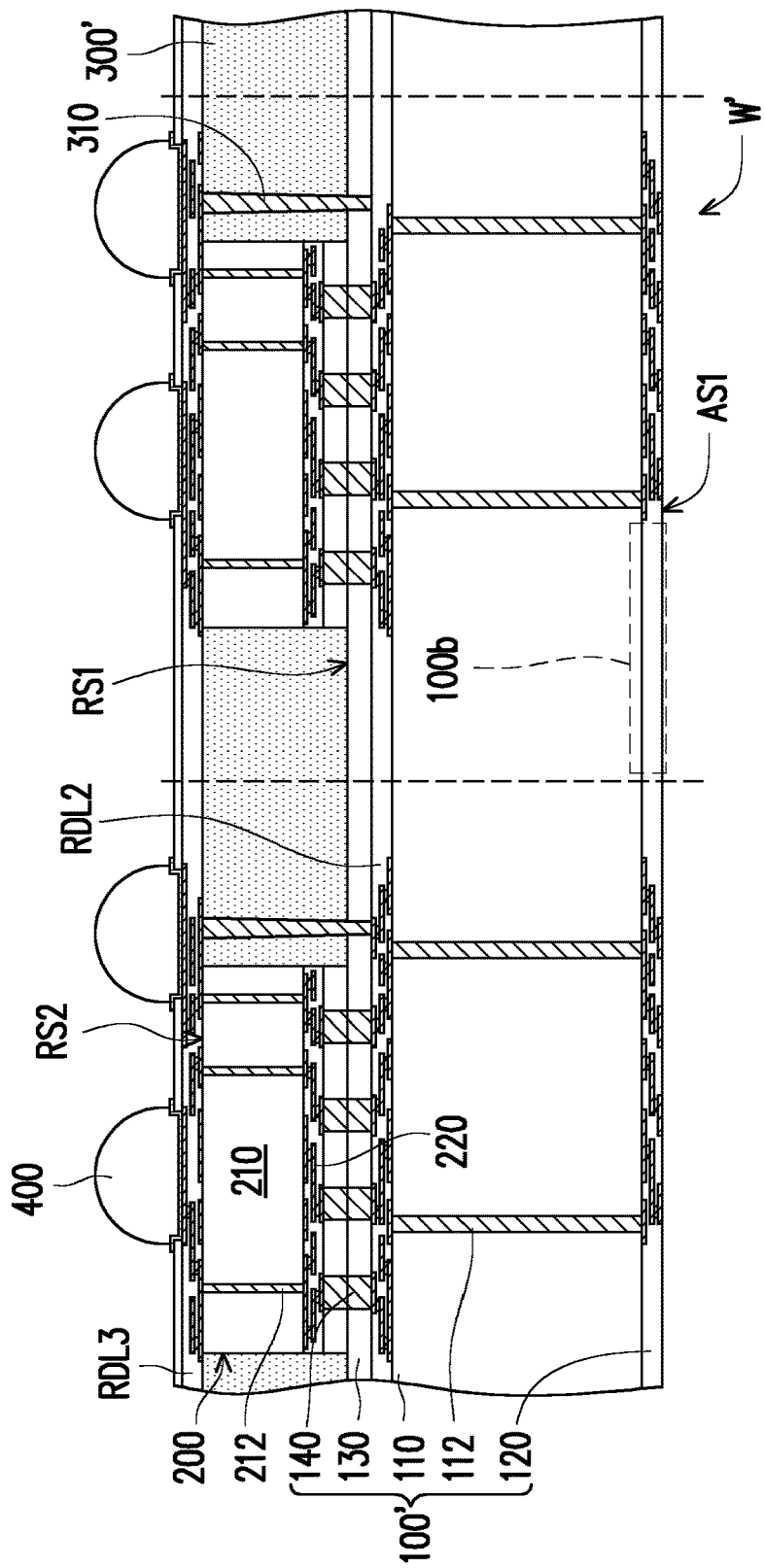

Referring to FIG. 8D, after forming the insulating encapsulant 300', a plurality of through insulator vias 310 may be formed in the insulating encapsulant 300'. In some embodiments, the through insulator vias 310 may be formed by forming a plurality of through holes in the insulating encapsulant 300' and filling conductive material into the through holes of the insulating encapsulant 300'. For example, the through holes in the insulating encapsulant 300' may be formed by laser drilling, mechanical drilling, photolithography or other suitable patterning processes, the conductive material may be deposited into the through holes of the insulating encapsulant 300' through plating or other suitable deposition processes, and the deposited conductive material may be polished back until the top surface of the insulating encapsulant 300' is exposed.

After forming the through insulator vias 310, a back-side redistribution circuit layer RDL3 is formed on the top surface of the insulating encapsulant 300' and the rear surfaces RS2 of the electric integrated circuit components 200. The back-side redistribution circuit layer RDL3 is electrically connected to the through insulator vias 310 and the through semiconductor vias 212 of the electric integrated circuit components 200. Furthermore, the back-side redistribution circuit layer RDL3 may be electrically connected to the second interconnection structure 220 through the through semiconductor vias 212. Although the formation of the redistribution circuit layer RDL3 is illustrated in FIG. 8D, the formation of the redistribution circuit layer RDL3 may be omitted in accordance with some alternative embodiments.

As shown in FIG. 8D, in some embodiments, the back-side redistribution circuit layer RDL3 may include conductive wirings and inter-dielectric layers stacked alternately. The distribution of the conductive wirings in the back-side redistribution circuit layer RDL3 is not limited in this disclosure.

After forming the back-side redistribution circuit layer RDL3, a plurality of conductive terminals 400 are formed on the back-side redistribution circuit layer RDL3. In some embodiments, the conductive terminals 400 are, for example, controlled collapse chip connection (C4) bumps, ball-grid array (BGA) balls or the like.

Figure 8E:
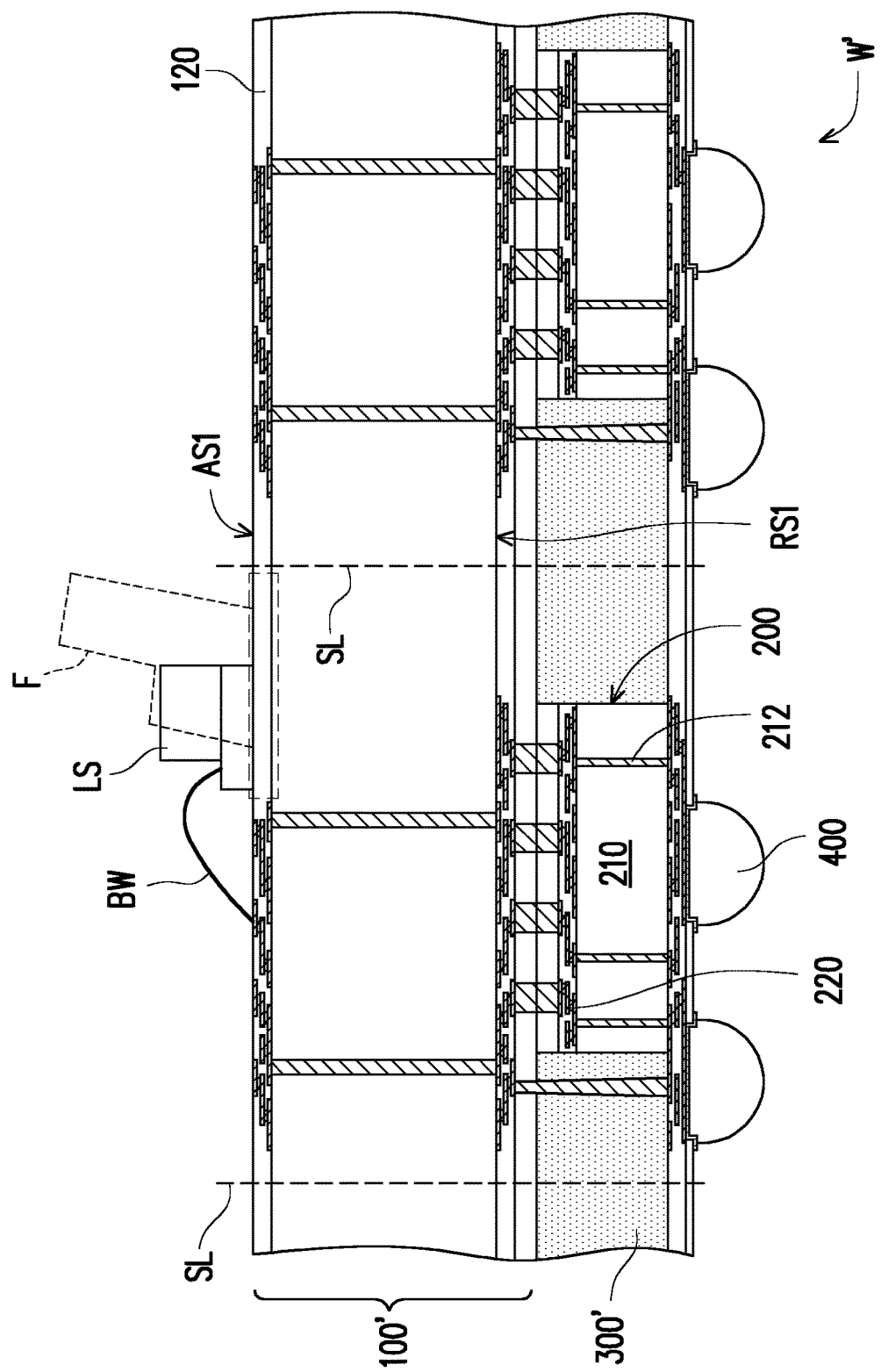

Referring to FIG. 8D and FIG. 8E, the resulted structure illustrated in FIG. 8 is flipped. Then, a plurality of light sources LS and a plurality of optical fiber adapters F are provided and installed onto the first active surface AS1 of the photonic wafer W'. The light sources LS are electrically connected to the first interconnection structure 120 and located above the optical input/output portions 100b. The optical fiber adapters F are located above the optical input/output portions 100b and suitable for adapting optical fibers (not shown). The light sources LS may be electrically controlled by the electric integrated circuit components 200 and emit the optical signal to optically communicate with the photonic integrated circuit components 100', while the optical fiber adapters F may receive the optical signal to optically communicate with the photonic integrated circuit components 100'. In some embodiments, the light sources LS may be light-emitting diode (LED) packages capable of emitting the optical signal to be processed by the optical input/output portions 100b. For example, the light sources LS may be surface mount type LED packages capable of emitting the optical signal having wavelength about 1550 nm. Furthermore, the light sources LS are, for example, electrically connected to the first interconnection structure 120 through bonding wires BW (e.g., gold wires formed by wire bonder). In some alternative embodiments, the light sources LS may be light-emitting diode (LED) chips capable of emitting the optical signal to be processed by the optical input/output portions 100b. Furthermore, the electric connection between the first interconnection structure 120 and the light sources LS (i.e. LED packages or LED chips) may be achieved by at least one conductive through via or flip-chip technology.

Figure 8F:
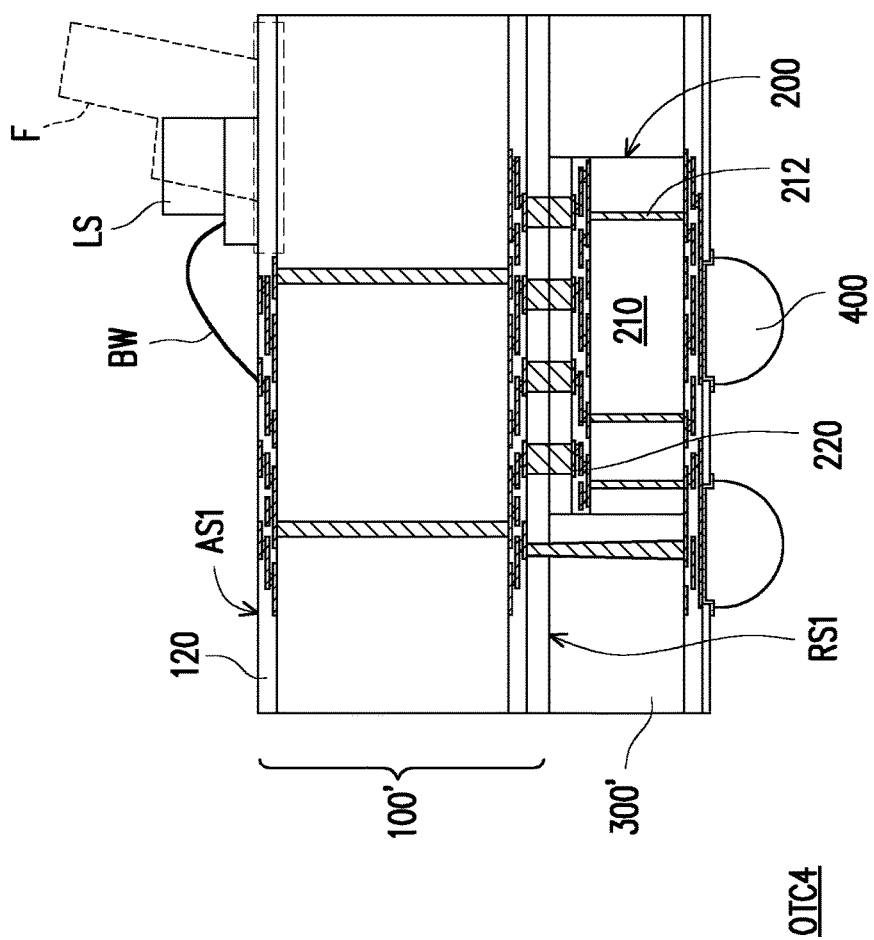

Referring to FIG. 8F, a singulation process is performed along the scribe line SL such that a plurality of singulated optical transceivers OTC4 are formed. In some embodiments, the singulated optical transceivers OTC4 may be further mounted onto a package substrate (not shown), and the package substrate may be a printed circuit board, an interposer (e.g., a silicon interposer including through silicon vias) and so on. As illustrated in FIG. 8E and FIG. 8F, the installation of the light sources LS and the optical fiber adapters F is performed before the singulation process for forming the singulated optical transceivers OTC4, however, the invention is not limited thereto. In some alternative embodiments, the installation of the light sources LS and the optical fiber adapters F may be performed after the singulation process.

As shown in FIG. 8F, the optical transceiver OTC4 include the photonic integrated circuit component 100', the electric integrated circuit component 200 and the insulating encapsulant 300'. The photonic integrated circuit component 100' includes an active surface AS1, a rear surface RS1 opposite to the active surface AS1 and at least one optical input/output portion 100b configured to transmit and receive the optical signal. The at least one optical input/output portion 100b is located on the active surface AS1. The electric integrated circuit component 100' is disposed on the rear surface RS1 of the photonic integrated circuit component 100'. For example, the electric integrated circuit component 200 is hybrid bonded with the rear surface RS1 of the photonic integrated circuit component 100'. The electric integrated circuit component 200 is electrically connected to the photonic integrated circuit component 100a. The insulating encapsulant 300' covers the rear surface RS1 of the photonic integrated circuit component 100'. The insulating encapsulant 300' laterally encapsulates the electric integrated circuit component 200. For example, the insulating encapsulant 300' may include a plurality of stacked dielectric layers which are optically transparent to the optical signal to be processed by the optical input/output portion 100b. In some alternative embodiments, the optical transceiver OTC4 may further include back-side redistribution circuit layer RDL3 disposed on the electric integrated circuit component 200 and the insulating encapsulant 300', wherein the back-side redistribution circuit layer RDL3 is electrically connected to at least one through semiconductor vias 212 of the electric integrated circuit component 200.

In the optical transceiver OTC4, since the light source LS and the optical fiber adapter F are installed on the active surface AS1 of the photonic integrated circuit component 100', optical loss between the optical input/output portion 100b and the light source LS/the optical fiber adapter F may be minimized. Furthermore, since the light source LS/the optical fiber adapter F and the electric integrated circuit component 200 are respectively disposed on opposite surfaces of the photonic integrated circuit component 100', the installation of the light source LS/the optical fiber adapter F and the electric integrated circuit component 200 may be easily controlled. Accordingly, the process window for installing the light sources LS and the optical fiber adapters F onto the first interconnection structure 120 is large.

In the above-mentioned optical transceivers (OTC and OTC1~OTC4), the optical loss between the optical input/output portion 100b and the light source LS/the optical fiber adapter F may be minimized.

In accordance with some embodiments of the disclosure, an optical transceiver including a photonic integrated circuit component, an electric integrated circuit component and an insulating encapsulant is provided. The photonic integrated circuit component includes at least one optical input/output portion configured to transmit and receive optical signal. The electric integrated circuit component is disposed on and electrically connected to the photonic integrated circuit component. The insulating encapsulant covers the at least one optical input/output portion of the photonic integrated circuit component. The insulating encapsulant laterally encapsulates the electric integrated circuit component. The insulating encapsulant is optically transparent to the optical signal.

In accordance with some embodiments of the disclosure, an optical transceiver including a photonic integrated circuit component, an electric integrated circuit component, an insulating encapsulant and a redistribution circuit layer is provided. The photonic integrated circuit component includes an electrical bonding portion and at least one optical input/output portion configured to transmit and receive optical signal. The electric integrated circuit component is disposed on the electrical bonding portion of the photonic integrated circuit component and is electrically connected to the photonic integrated circuit component. The insulating encapsulant is disposed on the optical input/output portion of the photonic integrated circuit component. The electric integrated circuit component is encapsulated by and embedded in the insulating encapsulant. The insulating encapsulant is optically transparent to the optical signal. The redistribution circuit layer is disposed on the electric integrated circuit component and the insulating encapsulant. The redistribution circuit layer is electrically connected to the electric integrated circuit component.

In accordance with some embodiments of the disclosure, an optical transceiver including a photonic integrated circuit component, an electric integrated circuit component and an insulating encapsulant is provided. The photonic integrated circuit component includes an active surface, a rear surface opposite to the active surface and at least one optical input/output portion configured to transmit and receive optical signal. The at least one optical input/output portion is located on the active surface. The electric integrated circuit component is disposed on the rear surface of the photonic integrated circuit component. The electric integrated circuit component is electrically connected to the photonic integrated circuit component. The insulating encapsulant covers the rear surface of the photonic integrated circuit component. The insulating encapsulant laterally encapsulates the electric integrated circuit component.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical transceiver, comprising:
   a photonic integrated circuit component comprising at least one optical input/output portion configured to transmit and receive optical signal, the photonic integrated circuit component comprising a first semiconductor substrate and a first interconnection structure on the first semiconductor substrate;
   an electric integrated circuit component, disposed on and electrically connected to the photonic integrated circuit component, the electric integrated circuit component comprising a second semiconductor substrate and a second interconnection structure on the second semiconductor substrate, and the second interconnection structure being bonded with a portion of the first interconnection structure; and
   an insulating encapsulant, covering the first interconnection structure and the at least one optical input/output portion of the photonic integrated circuit component, the insulating encapsulant encapsulating the electric integrated circuit component, and the insulating encapsulant being optically transparent to the optical signal.

2. The optical transceiver as claimed in claim 1, wherein the second interconnection structure of the electric integrated circuit component is hybrid bonded with the portion of the first interconnection structure of the photonic integrated circuit component.

3. The optical transceiver as claimed in claim 1, wherein the insulating encapsulant physically contacts sidewalls of the second interconnection structure and the second semiconductor substrate.

4. The optical transceiver as claimed in claim 1, wherein the insulating encapsulant comprises a plurality of stacked dielectric layers, and the plurality of stacked dielectric layers are optically transparent to the optical signal.

5. The optical transceiver as claimed in claim 1, wherein sidewalls of the insulating encapsulant are substantially aligned with sidewalls of the second semiconductor substrate and sidewalls of the second interconnection structure.

6. The optical transceiver as claimed in claim 1 further comprising:
   a redistribution circuit layer disposed on the electric integrated circuit component and the insulating encapsulant, wherein the redistribution circuit layer is electrically connected to at least one through via of the electric integrated circuit component.

7. The optical transceiver as claimed in claim 6 further comprising:
   a light source; and
   an optical fiber adapter, wherein the light source and the optical fiber adapter are disposed on and electrically connected to the redistribution circuit layer and are located above the at least one optical input/output portion of the photonic integrated circuit component.

8. An optical transceiver, comprising:
a photonic integrated circuit component comprising an electrical bonding portion and at least one optical input/output portion configured to transmit and receive optical signal;
an electric integrated circuit component disposed on the electrical bonding portion of the photonic integrated circuit component and electrically connected to the photonic integrated circuit component;
an insulating encapsulant disposed on the optical input/output portion of the photonic integrated circuit component, wherein the electric integrated circuit component being encapsulated by the insulating encapsulant, and the insulating encapsulant being optically transparent to the optical signal; and
a redistribution circuit layer disposed on the electric integrated circuit component and the insulating encapsulant, wherein the redistribution circuit layer is electrically connected to the electric integrated circuit component.

9. The optical transceiver as claimed in claim 8, wherein the electric integrated circuit component is hybrid bonded with the electrical bonding portion of the photonic integrated circuit component.

10. The optical transceiver as claimed in claim 8, wherein the insulating encapsulant physically contacts sidewalls of the electric integrated circuit component.

11. The optical transceiver as claimed in claim 8, wherein the insulating encapsulant comprises a plurality of stacked dielectric layers.

12. The optical transceiver as claimed in claim 8, wherein a material of the insulating encapsulant comprises silicon oxide, silicon nitride, and/or tetraethoxysilane (TEOS).

13. The optical transceiver as claimed in claim 8 further comprising:
a light source; and
an optical fiber adapter, wherein the light source and the optical fiber adapter are disposed on the redistribution circuit layer and are located above the at least one optical input/output portion of the photonic integrated circuit component.

14. An optical transceiver, comprising:
a photonic integrated circuit component comprising an active surface, a rear surface opposite to the active surface, sidewalls, and at least one optical input/output portion configured to transmit and receive optical signal, the sidewalls connecting the active surface and the rear surface, and the at least one optical input/output portion being distributed on the active surface;
an electric integrated circuit component disposed on the rear surface of the photonic integrated circuit component, the electric integrated circuit component being electrically connected to the photonic integrated circuit component; and
an insulating encapsulant, covering the rear surface of the photonic integrated circuit component, the insulating encapsulant encapsulating the electric integrated circuit component, and outer sidewalls of the insulating encapsulant being substantially aligned with the sidewalls of the photonic integrated circuit component.

15. The optical transceiver as claimed in claim 14, wherein the electric integrated circuit component is hybrid bonded with the rear surface of the photonic integrated circuit component.

16. The optical transceiver as claimed in claim 14, wherein the insulating encapsulant physically contacts sidewalls of the electric integrated circuit component.

17. The optical transceiver as claimed in claim 14, wherein the insulating encapsulant comprises a plurality of stacked dielectric layers, and the plurality of stacked dielectric layers are optically transparent to the optical signal.

18. The optical transceiver as claimed in claim 14, wherein a material of the insulating encapsulant comprises silicon oxide, silicon nitride, and/or tetraethoxysilane (TEOS).

19. The optical transceiver as claimed in claim 14 further comprising:
a redistribution circuit layer disposed on the electric integrated circuit component and the insulating encapsulant, wherein the redistribution circuit layer is electrically connected to at least one through via of the electric integrated circuit component.

20. The optical transceiver as claimed in claim 14 further comprising:
a light source; and
an optical fiber adapter, wherein the light source and the optical fiber adapter are disposed on the active surface of the photonic integrated circuit component and are located above the at least one optical input/output portion of the photonic integrated circuit component.

* * * * *